United States Patent
Pal et al.

(10) Patent No.: US 12,294,368 B2
(45) Date of Patent: May 6, 2025

(54) THREE-DIMENSIONAL STACKED PROGRAMMABLE LOGIC FABRIC AND PROCESSOR DESIGN ARCHITECTURE

(71) Applicant: Intel Corporation, Santa Clara, CA (US)

(72) Inventors: Rahul Pal, Bangalore (IN); Dheeraj Subbareddy, Portland, OR (US); Mahesh Kumashikar, Bangalore (IN); Dheemanth Nagaraj, Bangalore (IN); Rajesh Vivekanandham, Bangalore (IN); Anshuman Thakur, Beaverton, OR (US); Ankireddy Nalamalpu, Portland, OR (US); Md Altaf Hossain, Portland, OR (US); Atul Maheshwari, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 644 days.

(21) Appl. No.: 17/485,119

(22) Filed: Sep. 24, 2021

(65) Prior Publication Data
US 2022/0014202 A1    Jan. 13, 2022

(51) Int. Cl.
| | |
|---|---|
| *H03K 19/177* | (2020.01) |
| *G06F 15/78* | (2006.01) |
| *G06F 30/34* | (2020.01) |
| *H03K 19/17758* | (2020.01) |
| *H03K 19/17796* | (2020.01) |
| *H03K 19/08* | (2006.01) |

(52) U.S. Cl.
CPC ... *H03K 19/17796* (2013.01); *G06F 15/7892* (2013.01); *G06F 30/34* (2020.01); *H03K 19/17758* (2020.01); *H03K 19/08* (2013.01)

(58) Field of Classification Search
CPC ..... G06F 15/7892; G06F 30/34; H03K 19/08; H03K 19/17758; H03K 19/17796
See application file for complete search history.

(56) References Cited

U.S. PATENT DOCUMENTS

| | | | | |
|---|---|---|---|---|
| 10,523,207 | B2* | 12/2019 | How | H03K 19/17736 |
| 10,642,946 | B2* | 5/2020 | Teh | H01L 25/18 |
| 10,740,523 | B1* | 8/2020 | Klein | G06F 30/34 |
| 10,833,679 | B2* | 11/2020 | Clark | H01L 25/0657 |
| 2016/0049941 | A1 | 2/2016 | How et al. | |
| 2018/0322386 | A1* | 11/2018 | Sridharan | G06F 9/54 |
| 2019/0007050 | A1* | 1/2019 | Atsatt | H03K 19/17756 |
| 2019/0044515 | A1* | 2/2019 | Gutala | H01L 23/3675 |
| 2020/0119736 | A1* | 4/2020 | Weber | H03K 19/17756 |
| 2021/0326135 | A1* | 10/2021 | Subbareddy | G06F 9/3881 |

* cited by examiner

*Primary Examiner* — Kurtis R Bahr
(74) *Attorney, Agent, or Firm* — Fletcher Yoder, P.C.

(57) ABSTRACT

The present disclosure is directed to 3-D stacked architecture for Programmable Fabrics and Central Processing Units (CPUs). The 3-D stacked orientation enables reconfigurability of the fabric, and allows the fabric to function using coarse-grained and fine-grained acceleration for offloading CPU processing. Additionally, the programmable fabric may be able to function to interface with multiple other compute chiplet components in the 3-D stacked orientation. This enables multiple compute components to communicate without the need for offloading the data communications between the compute chiplets.

20 Claims, 15 Drawing Sheets

THREE-DIMENSIONAL STACKED PROGRAMMABLE LOGIC FABRIC AND PROCESSOR DESIGN ARCHITECTURE

BACKGROUND

This disclosure relates to 3-D stacked programmable logic fabric and processor design architecture. Specifically, incorporating the 3-D stacked attachment of computation elements to the programmable logic fabric to enable multi-use functionality.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be noted that these statements are to be read in this light, and not as admissions of any kind.

Integrated circuits are found in numerous electronic devices, from handheld devices, computers, gaming systems, robotic devices, automobiles, and more. Some integrated circuits, such as central processing units (CPUs)/microprocessors (μP) may utilize offload computing and/or acceleration to utilize other devices (e.g., programmable logic devices) to assist the CPU/μP in performing certain operations. However, certain compute models may be limited to due latency, memory coherency, or flexibility issues in the implementations used to provide the acceleration via the programmable logic devices. For example, FPGA's may be utilized to offload CPU computing and/or acceleration. The FPGAs may be implemented to accelerate a variety of workloads as coarse-grained offload engines over legacy interfaces, but the fixed cost of data transfer may limit potential for these uses. The FPGA may also function to perform fine-grained acceleration, but this may require significant architecture changes that would limit reconfigurability of the FPGA due to traditional two-dimensional FPGA design architecture. In two-dimensional constructions of FPGA architecture, the ability to implement fine-grained or coarse-grain acceleration is made at the time of FPGA and CPU architecture definition, and reconfigurability is not generally achievable.

BRIEF DESCRIPTION OF THE DRAWINGS

Various aspects of this disclosure may be better understood upon reading the following detailed description and upon reference to the drawings in which.

DETAILED DESCRIPTION

Figure 1:
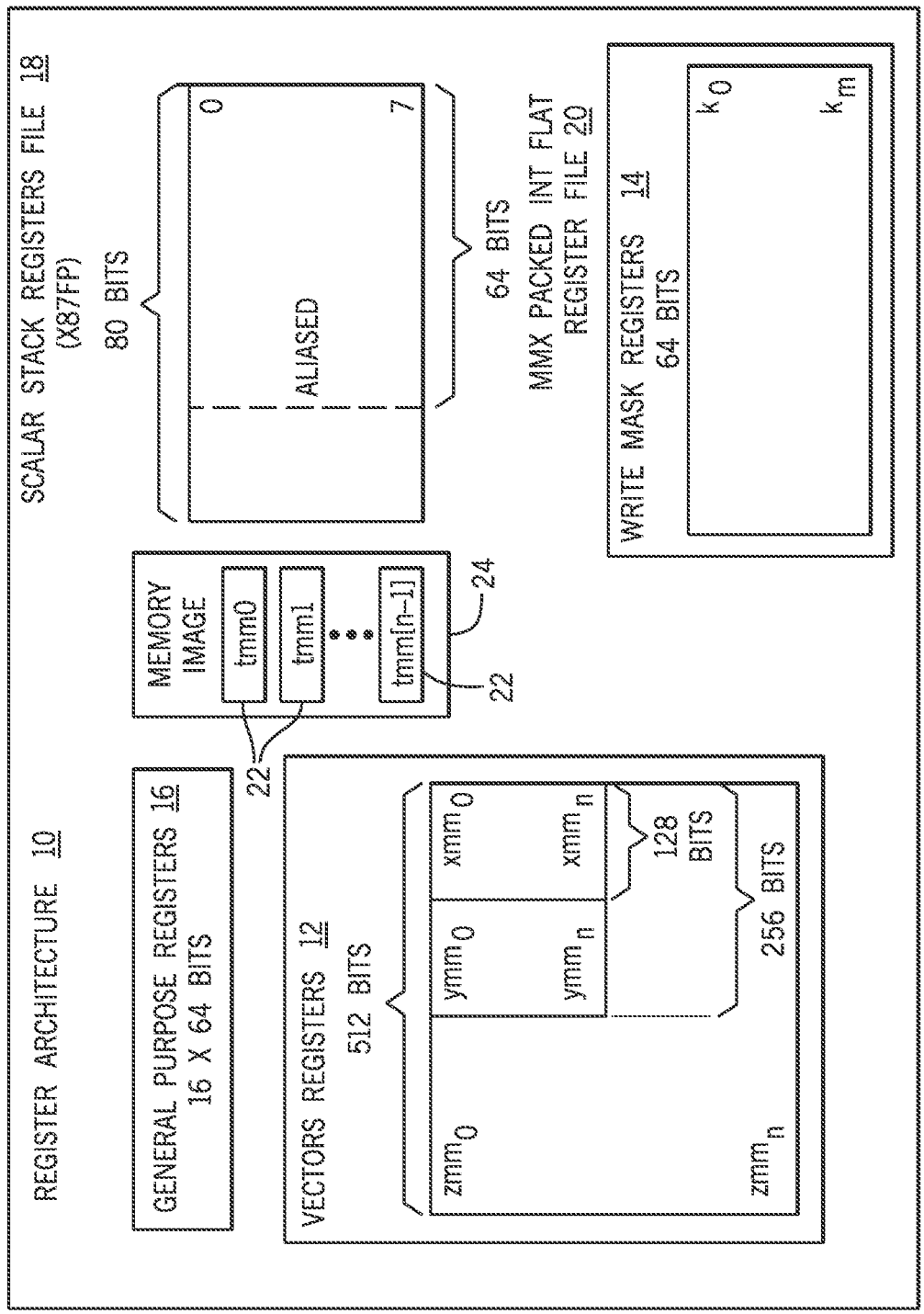
FIG. 1 is a block diagram of a register architecture, in accordance with an embodiment.
Figure 2:
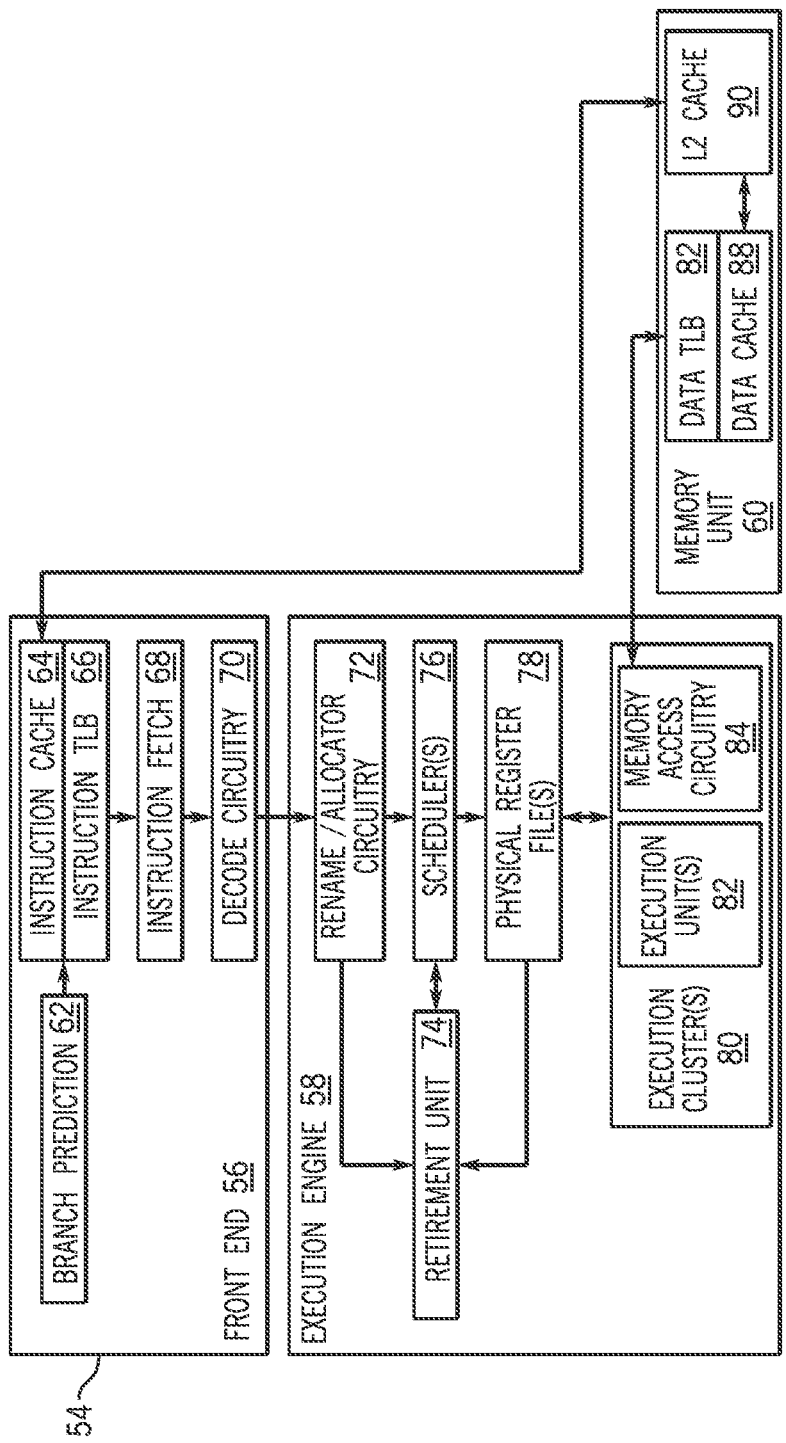
FIG. 2A is a block diagram illustrating an in-order pipeline and a register renaming, out-of-order issue/execution pipeline, in accordance with an embodiment.
FIG. 2B is a block diagram illustrating an in-order architecture core and a register renaming, out-of-order issue/execution architecture core to be included in a processor, in accordance with an embodiment.
Figure 3:
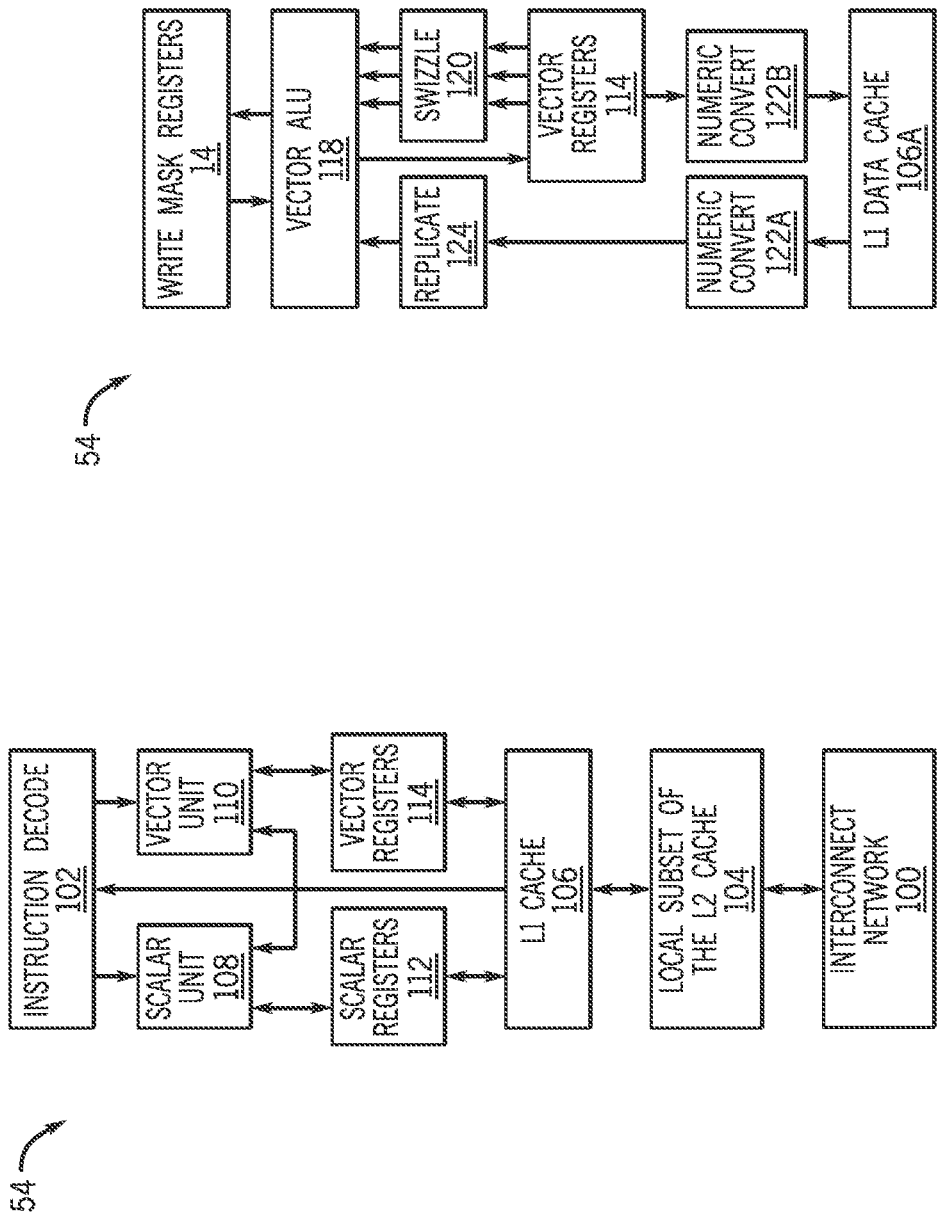
FIGS. 3A and 3B illustrate a block diagram of a more specific example in-order core architecture, which core would be one of several logic blocks (including other cores of the same type and/or different types) in a chip, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "including" and "having" are intended to be inclusive and mean that there may be additional elements other than the listed elements. Additionally, it should be understood that references to "some embodiments," "embodiments," "one embodiment," or "an embodiment" of the present disclosure are not intended to be interpreted as excluding the existence of additional embodiments that also incorporate the recited features. Furthermore, the phrase A "based on" B is intended to mean that A is at least partially based on B. Moreover, the term "or" is intended to be inclusive (e.g., logical OR) and not exclusive (e.g., logical XOR). In other words, the phrase A "or" B is intended to mean A, B, or both A and B. Moreover, this disclosure describes various data structures, such as instructions for an instruction set architecture. These are described as having certain domains (e.g., fields) and corresponding numbers of bits. However, it should be understood that these domains and sizes in bits are meant as examples and are not intended to be exclusive. Indeed, the data structures (e.g., instructions) of this disclosure may take any suitable form.

As previously discussed, various implementations for offload computing may have limitations due to placement of programmable fabrics in two-dimensional constructions. For example, the programmable fabric may be utilized to accelerate a variety of workloads as coarse-grained offload engines over legacy interfaces (e.g., PCIe). However, due to the high latency and low bandwidth nature of the interface, only workloads that contain a high volume of compute may benefit from the coarse-grained acceleration. Adding and exploiting fine-grained acceleration in CPUs may function to enable lower latency in processing, but may involve designing updated hardware architecture to implement the fine-grained the programmable fabric acceleration that may involve new algorithms and architecture redesigns for the programmable fabric. Therefore, the programmable fabric may be a function of either coarse-grained acceleration or fine-grained acceleration depending on location and size of the programmable fabric (e.g., field-programmable gate array (FPGA) relative to the cores of the CPU. This determination is made at the time of architecture of the FPGA. For example, multiple smaller FPGAs may be places near the center of the core, and increasing the size of the FPGA may impact core design. Additionally, placing the FPGA at the boundary of the core may limit interface options and negatively impact core System on a Chip (SoC)/Network on a Chip (NOC) design.

To mitigate the aforementioned problems with 2-D programmable fabric architecture, a three-dimensional stacked architecture of a programmable fabric (e.g., field-programmable gate array (FPGA) and a processor may be implemented to enable reconfigurability of offload computing. The programmable fabric may be well suited to various compute types more efficiently than may be performed in the processor. The programmable fabric may be sectioned according to performance requirements desired. For example, a portion of the programmable fabric may be configured to perform coarse-grained acceleration, and multiple smaller sections of the programmable fabric may be configured to perform fine-grain like acceleration. Additionally, computations that include a significant portion of swizzling and combinational logic, such as random number generation, message digest algorithms, and the like may be performed. Computations with non-traditional and/or arbitrary precision arithmetic (e.g., Galois/Montgomery arithmetic) are good candidates for computing using the programmable fabric. Many other computation types may also be good candidates for computing using the programmable fabric. For instance, polynomial/modulo arithmetic, approximate/probabilistic computation, modular exponentiation, stream graph traversals, motion estimation in video codecs, compression/decompression, Fast Fourier Transforms, and/or other computations may be good candidates for computing using the programmable fabric.

As discussed above, the 3D stacked programmable logic fabric (e.g., FPGA) and central processing unit (CPU) may be reprogrammable to perform multiple offload processing operations including fine-grained acceleration and coarse-grained acceleration. For example, the 3D stacked programmable logic fabric and CPU, in a fine-grained acceleration configuration, may make arithmetic logic units (ALUs) of the FPGA available for performing computations assisting the processor. The 3-D stacked hybrid FPGA and CPU architecture enables custom instructions for accelerating specific workloads for users. The custom instructions implemented using the embedded programmable fabric provides flexibility while adding workload acceleration for potential future workloads (e.g., SHA-512 running 8×). The 3D stacked FPGA and CPU may enable multi-use FPGA architecture and mitigate the need to designate FPGA hardware for a specific use at manufacture. The 3-D stacked FPGA and CPU may enable multi-use functionality of the FPGA by enabling the FPGA to be partitioned into reconfigurable sections according to different offload processing methods.

These features may be used in any suitable integrated circuit devices, including microprocessors, application-specific integrated circuits (ASICs), or field programmable gate arrays (FPGAs). The following architecture discussed below with respect to FIGS. 1-9 is intended to represent one example that may be used.

Register Architecture

FIG. 1 is a block diagram of a register architecture 10, in accordance with an embodiment. In the embodiment illustrated, there are a number (e.g., 32) of vector registers 12 that may be a number (e.g., 512) of bits wide. In the register architecture 10; these registers are referenced as zmm0 through $zmm_i$. The lower order (e.g., 256) bits of the lower n (e.g., 16) zmm registers are overlaid on corresponding registers ymm. The lower order (e.g., 128 bits) of the lower n zmm registers that are also the lower order n bits of the ymm registers are overlaid on corresponding registers xmm.

Write mask registers 14 may include m (e.g., 8) write mask registers (k0 through km), each having a number (e.g., 64) of bits. Additionally or alternatively, at least some of the write mask registers 14 may have a different size (e.g., 16 bits). At least some of the vector mask registers 12 (e.g., k0) are prohibited from being used as a write mask. When such vector mask registers are indicated, a hardwired write mask (e.g., 0xFFFF) is selected and, effectively disabling write masking for that instruction.

General-purpose registers 16 may include a number (e.g., 16) of registers having corresponding bit sizes (e.g., 64) that are used along with x86 addressing modes to address memory operands. These registers may be referenced by the names RAX, RBX, RCX, RDX, RBP, RSI, RDI, RSP, and R8 through R15. Parts (e.g., 32 bits of the registers) of at least some of these registers may be used for modes (e.g., 32-bit mode) that is shorter than the complete length of the registers.

Scalar floating-point stack register file (x87 stack) 18 has an MMX packed integer flat register file 20 is aliased. The x87 stack 18 is an eight-element (or other number of elements) stack used to perform scalar floating-point operations on floating point data using the x87 instruction set extension. The floating-point data may have various levels of precision (e.g., 16, 32, 64, 80, or more bits). The MMX packed integer flat register files 20 are used to perform operations on 64-bit packed integer data, as well as to hold operands for some operations performed between the MMX packed integer flat register files 20 and the XMM registers.

Alternative embodiments may use wider or narrower registers. Additionally, alternative embodiments may use more, less, or different register files and registers. For example, some extensions used by the processor may have other associated registers. For instance, an Advanced Matrix Extension (AMX) may utilize a 64-bit programming paradigm that utilizes two-dimensional registers/tiles 22 representing sub-arrays from a larger two-dimensional memory image 24. The two-dimensional memory image 24 may be accessible similar to how the other registers are accessed. Additionally or alternatively, the two-dimensional memory image 24 may be separate from memory used to store the other registers and instead may be accessible via a data cache unit. The AMX may also utilize an accelerator that operates on the tiles 22. For instance, the accelerator may include a tile matrix multiply unit (TMUL) that is operable to perform multiplies and adds on the tiles 22. In some embodiments, the tiles 22 may be allocated into one of several palettes. For example, an initialization palette may represent an initialized state while a divided palette may divide the two-dimensional memory image 24 into a number (e.g., 8) of tiles. In some embodiments, each allocation for the tiles may have a maximum size (e.g., 1 or 2 kB) relative to an overall size (e.g., 8 or 16 kB) of the two-dimensional memory image 24. Additionally or alternatively, the sizes of the tiles may be programmable to be set by a user/programmer. Additionally, the palettes may also be configurable with new palette entries capable of allocating resources of the two-dimensional memory image 24 as needed.

Core Architectures, Processors, and Computer Architectures

Processor cores may be implemented in different ways, for different purposes, and in different processors. For instance, implementations of such cores may include: 1) a general purpose in-order core suitable for general-purpose computing; 2) a high performance general purpose out-of-order core suitable for general-purpose computing; 3) a special purpose core suitable for primarily for graphics, two-dimensional matrix multiplication/addition, and/or scientific (throughput) computing. Implementations of different processors may include: 1) a CPU including one or more general purpose in-order cores suitable for general-purpose computing and/or one or more general purpose out-of-order cores suitable for general-purpose computing; and 2) a coprocessor including one or more special purpose cores primarily for matrix arithmetic, graphics, and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as matrix arithmetic, integrated graphics, and/or scientific (throughput) logic, or as special purpose cores); and 4) a system on a chip that may include on the same die the described CPU (sometimes referred to as the application core(s) or application processor(s)), the above described coprocessor, and additional functionality. Example core architectures are described next, followed by descriptions of example processors and computer architectures.

In-Order and Out-of-Order Core Architecture

FIG. 2A is a block diagram illustrating an in-order pipeline and a register renaming, out-of-order issue/execution pipeline according to an embodiment of the disclosure. FIG. 2B is a block diagram illustrating both an embodiment of an in-order architecture core and an example register renaming, out-of-order issue/execution architecture core to be included in a processor according to embodiments. The solid lined boxes in FIGS. 2A and 2B illustrate the in-order pipeline and in-order core, while the addition of the dashed lined boxes illustrates the register renaming, out-of-order issue/execution pipeline and core. Given that the in-order aspect is a subset of the out-of-order aspect, the out-of-order aspect will be described.

In FIG. 2A, a pipeline 30 in the processor includes a fetch stage 32, a length decode stage 34, a decode stage 36, an allocation stage 38, a renaming stage 40, a scheduling (also known as a dispatch or issue) stage 42, a register read/memory read stage 44, an execute stage 46, a write back/memory write stage 48, an exception handling stage 50, and a commit stage 52.

FIG. 2B shows a processor core 54 including a front-end unit 56 coupled to an execution engine unit 58, and both are coupled to a memory unit 60. The processor core 54 may be a reduced instruction set computing (RISC) core, a complex instruction set computing (CISC) core, a very long instruction word (VLIW) core, or a hybrid or alternative core type. As yet another option, the processor core 54 may be a special-purpose core, such as, for example, a network or communication core, compression engine, coprocessor core, general purpose computing graphics processing unit (GPGPU) core, graphics core, or the like.

The front-end unit 56 includes a branch prediction unit 62 coupled to an instruction cache unit 64 that is coupled to an instruction translation lookaside buffer (TLB) 66. The TLB 66 is coupled to an instruction fetch unit 68. The instruction fetch unit 68 is coupled to a decode circuitry 70. The decode circuitry 70 (or decoder) may decode instructions and generate as an output one or more micro-operations, micro-code entry points, microinstructions, other instructions, or other control signals, which are decoded from, or which otherwise reflect, or are derived from, the original instructions. The decode circuitry 70 may be implemented using various different mechanisms. Examples of suitable mechanisms include, but are not limited to, look-up tables, hardware implementations, programmable logic arrays (PLAs), microcode read only memories (ROMs), etc. The processor core 54 may include a microcode ROM or other medium that stores microcode for macroinstructions (e.g., in decode circuitry 70 or otherwise within the front-end unit 56). The decode circuitry 70 is coupled to a rename/allocator unit 72 in the execution engine unit 58.

The execution engine unit 58 includes a rename/allocator unit 72 coupled to a retirement unit 74 and a set of one or more scheduler unit(s) 76. The scheduler unit(s) 76 represents any number of different schedulers, including reservations stations, central instruction window, etc. The scheduler unit(s) 76 is coupled to physical register file(s) unit(s) 78. Each of the physical register file(s) unit(s) 78 represents one or more physical register files storing one or more different data types, such as scalar integers, scalar floating points, packed integers, packed floating points, vector integers, vector floating points, statuses (e.g., an instruction pointer that is the address of the next instruction to be executed), etc. In one embodiment, the physical register file(s) unit(s) 78 includes the vector registers 12, the write mask registers 14, and/or the x87 stack 18. These register units may provide architectural vector registers, vector mask registers, and general-purpose registers. The physical register file(s) unit(s) 78 is overlapped by the retirement unit 74 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.).

The retirement unit 74 and the physical register file(s) unit(s) 78 are coupled to an execution cluster(s) 80. The execution cluster(s) 80 includes a set of one or more execution units 82 and a set of one or more memory access circuitries 84. The execution units 82 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform multiple different functions. The scheduler unit(s) 76, physical register file(s) unit(s) 78, and execution cluster(s) 80 are shown as being singular or plural because some processor cores 54 create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster. In the case of a separate memory access pipeline, a processor core 54 for the separate memory access pipeline is the only the execution cluster 80 that has the memory access circuitry 84). It should also be understood that where separate pipelines are used, one or more of these pipelines may be out-of-order issue/execution and the rest perform in-order execution.

The set of memory access circuitry 84 is coupled to the memory unit 60. The memory unit 60 includes a data TLB unit 86 coupled to a data cache unit 88 coupled to a level 2 (L2) cache unit 90. The memory access circuitry 84 may include a load unit, a store address unit, and a store data unit, each of which is coupled to the data TLB unit 86 in the memory unit 60. The instruction cache unit 64 is further coupled to the level 2 (L2) cache unit 90 in the memory unit 60. The L2 cache unit 90 is coupled to one or more other levels of caches, accelerators, and/or to a main memory.

By way of example, the register renaming, out-of-order issue/execution core architecture may implement the pipeline 30 as follows: 1) the instruction fetch unit 68 performs the fetch and length decoding stages 32 and 34 of the pipeline 30; 2) the decode circuitry 70 performs the decode stage 36 of the pipeline 30; 3) the rename/allocator unit 72 performs the allocation stage 38 and renaming stage 40 of the pipeline; 4) the scheduler unit(s) 76 performs the schedule stage 42 of the pipeline 30; 5) the physical register file(s) unit(s) 78 and the memory unit 60 perform the register read/memory read stage 44 of the pipeline 30; the execution cluster 80 performs the execute stage 46 of the pipeline 30; 6) the memory unit 60 and the physical register file(s) unit(s) 78 perform the write back/memory write stage 48 of the pipeline 30; 7) various units may be involved in the exception handling stage 50 of the pipeline; and/or 8) the retirement unit 74 and the physical register file(s) unit(s) 78 perform the commit stage 52 of the pipeline 30.

The processor core 54 may support one or more instructions sets, such as an x86 instruction set (with or without additional extensions for newer versions); a MIPS instruction set of MIPS Technologies of Sunnyvale, CA; an ARM instruction set (with optional additional extensions such as NEON) of ARM Holdings of Sunnyvale, CA Additionally or alternatively, the processor core 54 includes logic to support a packed data instruction set extension (e.g., AVX1, AVX2), thereby allowing the operations used by multimedia applications to be performed using packed data. Furthermore, as previously mentioned, the processor core 54 may include logic and/or circuitry to support an AMX instruction set of Intel Corporation of Santa Clara, CA.

It should be understood that the core may support multi-threading (executing two or more parallel sets of operations or threads), and may do so in a variety of ways including time sliced multithreading, simultaneous multithreading (where a single physical core provides a logical core for each of the threads that physical core is simultaneously multi-threading), or a combination thereof, such as a time-sliced fetching and decoding and simultaneous multithreading in INTEL® Hyperthreading technology.

While register renaming is described in the context of out-of-order execution, register renaming may be used in an in-order architecture. While the illustrated embodiment of the processor also includes a separate instruction cache unit 64, a separate data cache unit 88, and a shared L2 cache unit 90, some processors may have a single internal cache for both instructions and data, such as, for example, a Level 1 (L1) internal cache, or multiple levels of the internal cache. In some embodiments, the processor may include a combination of an internal cache and an external cache that is external to the processor core 54 and/or the processor. Alternatively, some processors may use a cache that is external to the processor core 54 and/or the processor.

FIGS. 3A and 3B illustrate more detailed block diagrams of an in-order core architecture. The processor core 54 includes one or more logic blocks (including other cores of the same type and/or different types) in a chip. The logic blocks communicate through a high-bandwidth interconnect network (e.g., a ring network) with some fixed function logic, memory I/O interfaces, and other I/O logic, depending on the application.

FIG. 3A is a block diagram of a single processor core 54, along with its connection to an on-die interconnect network 100 and with its local subset of the Level 2 (L2) cache 104, according to embodiments of the disclosure. In one embodiment, an instruction decoder 102 supports the x86 instruction set with a packed data instruction set extension. An L1 cache 106 allows low-latency accesses to cache memory into the scalar and vector units. While in one embodiment (to simplify the design), a scalar unit 108 and a vector unit 110 use separate register sets (respectively, scalar registers 112 (e.g., x87 stack 18) and vector registers 114 (e.g., vector registers 12) and data transferred between them is written to memory and then read back in from a level 1 (L1) cache 106, alternative embodiments of the disclosure may use a different approach (e.g., use a single register set or include a communication path that allow data to be transferred between the two register files without being written and read back).

The local subset of the L2 cache 104 is part of a global L2 cache unit 90 that is divided into separate local subsets, one per processor core. Each processor core 54 has a direct access path to its own local subset of the L2 cache 104. Data read by a processor core 54 is stored in its L2 cache 104 subset and can be accessed quickly, in parallel with other processor cores 54 accessing their own local L2 cache subsets. Data written by a processor core 54 is stored in its own L2 cache 104 subset and is flushed from other subsets, if necessary. The interconnection network 100 ensures coherency for shared data between cores and/or accelerators. The interconnection network 100 is bi-directional to allow agents such as processor cores, L2 caches, and other logic blocks to communicate with each other within the chip. Each data-path may have a number (e.g., 1012) of bits in width per direction.

FIG. 3B is an expanded view of part of the processor core in FIG. 3A according to embodiments of the disclosure. FIG. 3B includes an L1 data cache 106A part of the L1 cache 106, as well as more detail regarding the vector unit 110 and the vector registers 114. Specifically, the vector unit 110 may be a vector processing unit (VPU) (e.g., a vector arithmetic logic unit (ALU) 118) that executes one or more of integer, single-precision float, and double-precision float instructions. The VPU supports swizzling the register inputs with a swizzle unit 120, numeric conversion with numeric convert units 122A and 122B, and replication with a replication unit 124 on the memory input. The write mask registers 14 allow predicating resulting vector writes.

Figure 4:
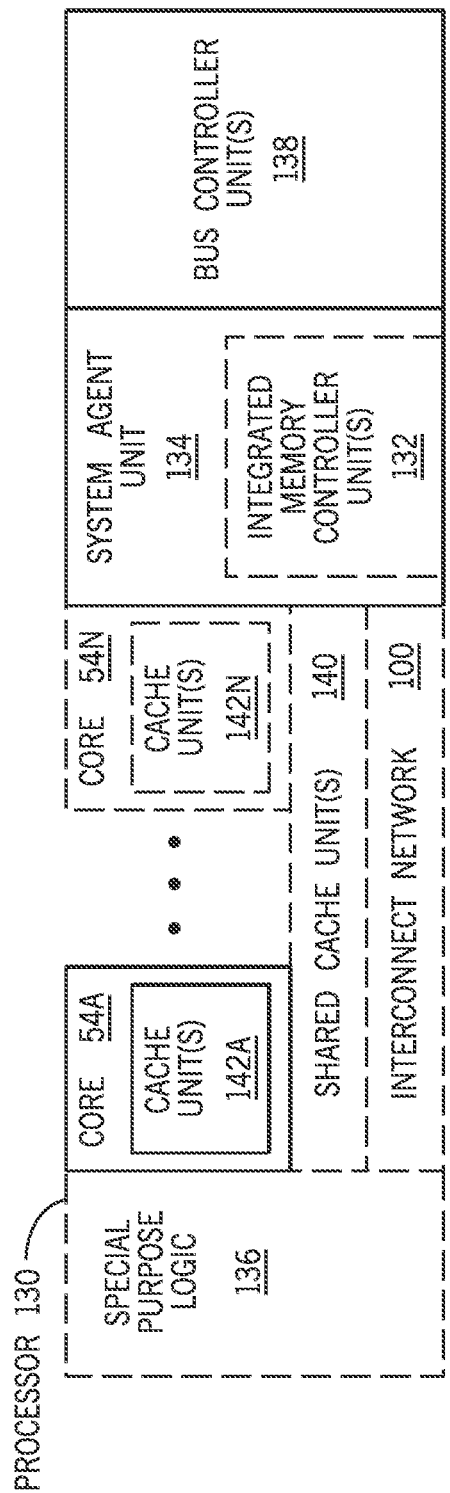
FIG. 4 is a block diagram of a processor that may have more than one core, may have an integrated memory controller, and may have integrated graphics, in accordance with an embodiment.

FIG. 4 is a block diagram of a processor 130 that may have more than one processor core 54, may have an integrated memory controller unit(s) 132, and may have integrated graphics according to embodiments of the disclosure. The solid lined boxes in FIG. 4 illustrate a processor 130 with a single core 54A, a system agent unit 134, a set of one or more bus controller unit(s) 138, while the optional addition of the dashed lined boxes illustrates the processor 130 with multiple cores 54A-N, a set of one or more integrated memory controller unit(s) 132 in the system agent unit 134, and a special purpose logic 136.

Thus, different implementations of the processor 130 may include: 1) a CPU with the special purpose logic 136 being matrix arithmetic, integrated graphics, and/or scientific (throughput) logic (which may include one or more cores), and the cores 54A-N being one or more general purpose cores (e.g., general purpose in-order cores, general purpose out-of-order cores, or a combination thereof); 2) a coprocessor with the cores 54A-N being a relatively large number of special purpose cores intended primarily for matrix arithmetic, graphics, and/or scientific (throughput); and 3) a coprocessor with the cores 54A-N being a relatively large number of general purpose in-order cores. Thus, the processor 130 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), an embedded processor, or the like. The processor 130 may be implemented on one or more chips. The processor 130 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 140, and external memory (not shown) coupled to the set of integrated memory controller unit(s) 132. The set of shared cache units 140 may include one or more mid-level caches, such as level 2 (L2), level 3 (L3), level 4 (L4), or other levels of cache, a last level cache (LLC), and/or combinations thereof. While a ring-based interconnect network 100 may interconnect the special purpose logic 136 (integrated graphics logic is an example of special purpose logic 136), the set of shared cache units 140, and/or the system agent unit 134/integrated memory controller unit(s) 132 may use any number of known techniques for interconnecting such units. For example, coherency may be maintained between one or more cache units 142A-N and cores 54A-N.

In some embodiments, one or more of the cores 54A-N are capable of multi-threading. The system agent unit 134 includes those components coordinating and operating cores 54A-N. The system agent unit 134 may include, for example, a power control unit (PCU) and a display unit. The PCU may be or may include logic and components used to regulate the power state of the cores 54A-N and the special purpose logic 136. The display unit is used to drive one or more externally connected displays.

The cores 54A-N may be homogenous or heterogeneous in terms of architecture instruction set. That is, two or more of the cores 54A-N may be capable of execution of the same instruction set, while others may be capable of executing only a subset of a single instruction set or a different instruction set.

Computer Architecture

Figure 5:
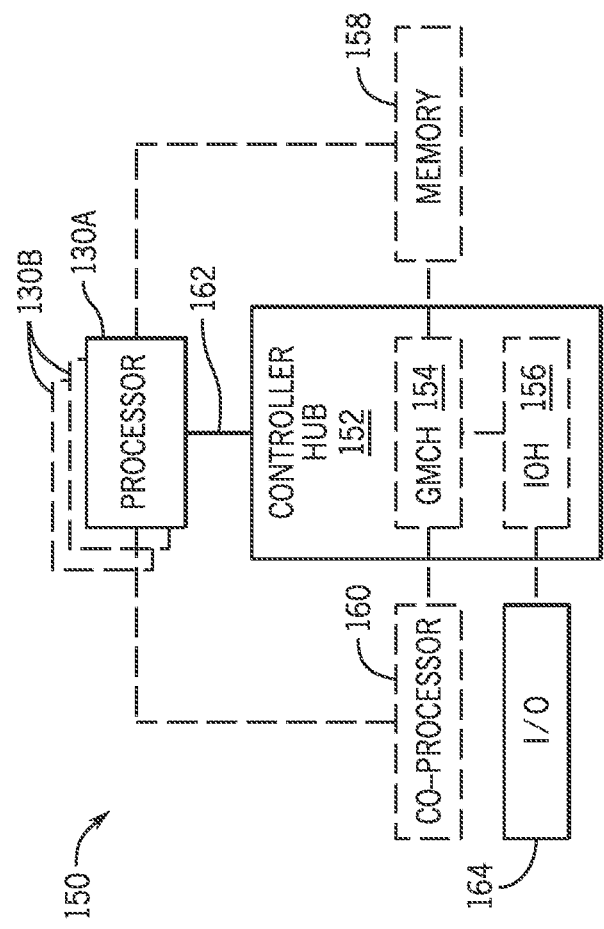
FIG. 5 shown a block diagram of a system, in accordance with an embodiment.
Figure 6:
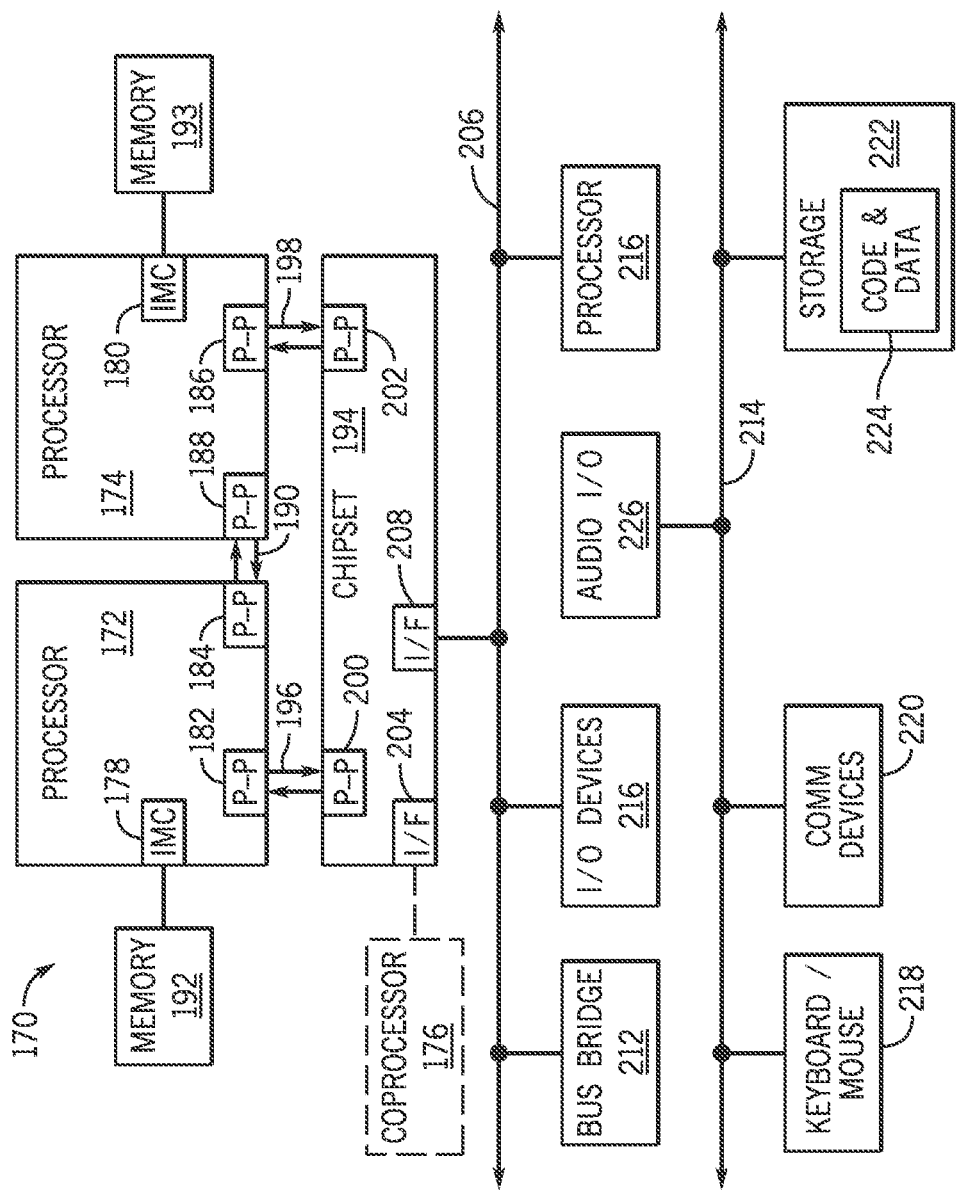
FIG. 6 is a block diagram of a first more specific example system, in accordance with an embodiment.
Figure 7:
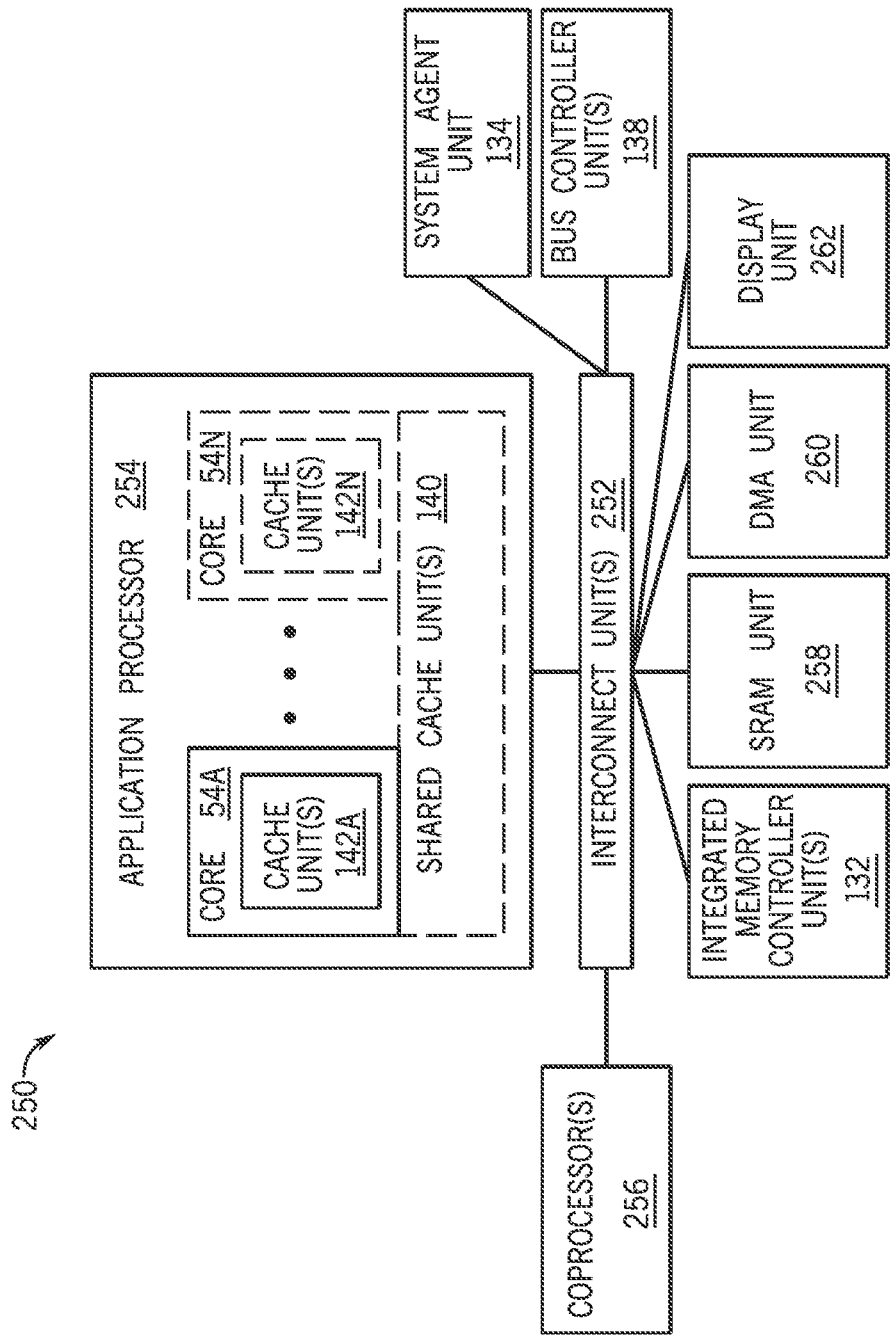
FIG. 7 is a block diagram of a system on a chip (SoC), in accordance with an embodiment; p

FIGS. 5-7 are block diagrams of embodiments of computer architectures. These architectures may be suitable for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices. In general, a wide variety of systems or electronic devices capable of incorporating the processor 130 and/or other execution logic.

Referring now to FIG. 5, shown is a block diagram of a system 150 in accordance with an embodiment. The system 150 may include one or more processors 130A, 130B that is coupled to a controller hub 152. The controller hub 152 may include a graphics memory controller hub (GMCH) 154 and an Input/Output Hub (IOH) 156 (which may be on separate chips); the GMCH 154 includes memory and graphics controllers to which are coupled memory 158 and a coprocessor 160; the IOH 156 couples input/output (I/O) devices 164 to the GMCH 154. Alternatively, one or both of the memory and graphics controllers are integrated within the processor 130 (as described herein), the memory 158 and the coprocessor 160 are coupled to (e.g., directly to) the processor 130A, and the controller hub 152 in a single chip with the IOH 156.

The optional nature of an additional processor 130B is denoted in FIG. 5 with broken lines. Each processor 130A, 130B may include one or more of the processor cores 54 described herein and may be some version of the processor 130.

The memory 158 may be, for example, dynamic random-access memory (DRAM), phase change memory (PCM), or a combination thereof. For at least one embodiment, the controller hub 152 communicates with the processor(s) 130A, 130B via a multi-drop bus, such as a frontside bus (FSB), point-to-point interface such as QuickPath Interconnect (QPI), or similar connection 162.

In one embodiment, the coprocessor 160 is a special-purpose processor, such as, for example, a high-throughput MIC processor, a network or communication processor, a compression engine, a graphics processor, a GPGPU, an embedded processor, or the like. In an embodiment, the controller hub 152 may include an integrated graphics accelerator and/or the AMX accelerator (e.g., TMUL).

There can be a variety of differences between the physical resources of the processors 130A, 130B in terms of a spectrum of metrics of merit including architectural, micro-architectural, thermal, power consumption characteristics, and the like.

In some embodiments, the processor 130A executes instructions that control data processing operations of a general type. Embedded within the instructions may be coprocessor instructions. The processor 130A recognizes these coprocessor instructions as being of a type that should be executed by the attached coprocessor 160. Accordingly, the processor 130A issues these coprocessor instructions (or control signals representing coprocessor instructions) on a coprocessor bus or other interconnect, to the coprocessor 160. The coprocessor 160 accepts and executes the received coprocessor instructions. Additionally or alternatively, the processor 130A may recognize coprocessor instructions for a programmable fabric and may issue these programmable fabric instructions to the TMUL that, in turn, directs the programmable fabric instructions to the programmable fabric.

Referring now to FIG. 6, shown is a more detailed block diagram of a multiprocessor system 170 in accordance with an embodiment. As shown in FIG. 6, the multiprocessor system 170 is a point-to-point interconnect system, and includes a processor 172 and a processor 174 coupled via a point-to-point interface 190. Each of the processors 172 and 174 may be some version of the processor 130. In one embodiment of the disclosure, processors 172 and 174 are respectively processors 130A and 130B, while coprocessor 176 is coprocessor 160. In another embodiment, processors 172 and 174 are respectively processor 130A and coprocessor 160.

Processors 172 and 174 are shown including integrated memory controller (IMC) units 178 and 180, respectively. The processor 172 also includes point-to-point (P-P) interfaces 182 and 184 as part of its bus controller units. Similarly, the processor 174 includes P-P interfaces 186 and 188. The processors 172, 174 may exchange information via a point-to-point interface 190 using P-P interfaces 184, 188. As shown in FIG. 6, IMCs 178 and 180 couple the processors to respective memories, namely a memory 192 and a memory 193 that may be different portions of main memory locally attached to the respective processors 172, 174.

Processors 172, 174 may each exchange information with a chipset 194 via individual P-P interfaces 196, 198 using point-to-point interfaces 182, 200, 186, 202. Chipset 194 may optionally exchange information with the coprocessor 176 via a high-performance interface 204. In an embodiment, the coprocessor 176 is a special-purpose processor, such as, for example, a high-throughput MIC processor, a network or communication processor, a compression engine, a graphics processor, a GPGPU, an embedded processor, or the like.

A shared cache (not shown) may be included in either processor 172 or 174 or outside of both processors 172 or 174 that is connected with the processors 172, 174 via respective P-P interconnects such that either or both processors' local cache information may be stored in the shared cache if a respective processor is placed into a low power mode.

The chipset 194 may be coupled to a first bus 206 via an interface 208. In an embodiment, the first bus 206 may be a Peripheral Component Interconnect (PCI) bus or a bus such as a PCI Express bus or another third generation I/O interconnect bus, although the scope of the present disclosure is not so limited.

As shown in FIG. 6, various I/O devices 210 may be coupled to first bus 206, along with a bus bridge 212 that couples the first bus 206 to a second bus 214. In an embodiment, one or more additional processor(s) 216, such as coprocessors, high-throughput MIC processors, GPGPUs, accelerators (such as, e.g., graphics accelerators or digital signal processing (DSP) units), field programmable gate arrays, or any other processors, are coupled to the first bus 206. In an embodiment, the second bus 214 may be a low pin count (LPC) bus. Various devices may be coupled to the second bus 214 including, for example, a keyboard and/or mouse 218, communication devices 220 and a storage unit 222 such as a disk drive or other mass storage device which may include instructions/code and data 224, in an embodiment. Further, an audio I/O 226 may be coupled to the second bus 214. Note that other architectures may be deployed for the multiprocessor system 170. For example, instead of the point-to-point architecture of FIG. 6, the multiprocessor system 170 may implement a multi-drop bus or other such architectures.

Referring now to FIG. 7, shown is a block diagram of a SoC 250 in accordance with an embodiment. Similar elements in FIG. 4 have like reference numerals. Also, dashed lined boxes are optional features included in some SoCs 250. In FIG. 7, an interconnect unit(s) 252 is coupled to: an application processor 254 that includes a set of one or more cores 54A-N that includes cache units 142A-N, and shared cache unit(s) 140; a system agent unit 134; a bus controller unit(s) 138; an integrated memory controller unit(s) 132; a set or one or more coprocessors 256 that may include integrated graphics logic, an image processor, an audio processor, and/or a video processor; a static random access memory (SRAM) unit 258; a direct memory access (DMA) unit 260; and a display unit 262 to couple to one or more external displays. In an embodiment, the coprocessor(s) 256 include a special-purpose processor, such as, for example, a network or communication processor, a compression engine, a GPGPU, a high-throughput MIC processor, an embedded processor, or the like.

Embodiments of the mechanisms disclosed herein may be implemented in hardware, software, firmware, or a combination of such implementation approaches. Embodiments of the disclosure may be implemented as computer programs and/or program code executing on programmable systems including at least one processor, a storage system (including volatile and non-volatile memory and/or storage elements), at least one input device, and at least one output device.

Program code, such as data 224 illustrated in FIG. 6, may be applied to input instructions to perform the functions described herein and generate output information. The output information may be applied to one or more output devices. For purposes of this application, a processing system includes any system that has a processor, such as, for example, a digital signal processor (DSP), a microcontroller, an application-specific integrated circuit (ASIC), or a microprocessor.

The program code may be implemented in a high-level procedural or object-oriented programming language to communicate with a processing system. The program code may also be implemented in an assembly language or in a machine language. In fact, the mechanisms described herein are not limited in scope to any particular programming language. In any case, the language may be a compiled language or an interpreted language.

One or more aspects of at least one embodiment may be implemented by representative instructions stored on a machine-readable medium that represents various logic within the processor that, when read by a machine causes the machine to fabricate logic to perform the techniques described herein. Such representations, known as "IP cores," may be stored on a tangible, machine readable medium and supplied to various customers or manufacturing facilities to load into the fabrication machines that make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic cards, optical cards, or any other type of media suitable for storing electronic instructions.

Accordingly, embodiments of the embodiment include non-transitory, tangible machine-readable media containing instructions or containing design data, such as designs in Hardware Description Language (HDL) that may define structures, circuits, apparatuses, processors and/or system features described herein. Such embodiments may also be referred to as program products.

Programmable Logic Device

Figure 8:
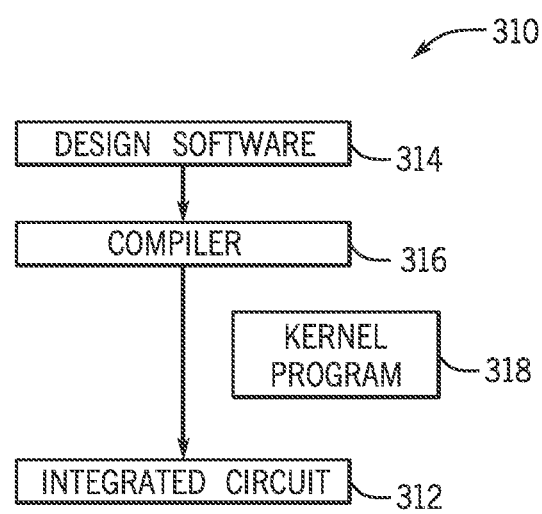
FIG. 8 is a block diagram of a process for programming an integrated circuit including a programmable fabric, in accordance with an embodiment.

As previously noted, the processor 130 may utilize one or more programmable fabrics (e.g., FPGAs) for acceleration via an AMX (and/or other) extension. With the foregoing in mind, FIG. 8 illustrates a block diagram of a system 310 for configuring a programmable device. A designer may implement functionality on an integrated circuit, such as an integrated circuit 312 that includes some reconfigurable circuitry, such as an FPGA. A designer may implement a circuit design to be programmed onto the IC 312 using design software 314, such as a version of Quartus by Altera™. The design software 314 may use a compiler 316 to generate a low-level circuit-design, which may be provided as a kernel program, sometimes known as a program object file or bitstream, that programs the integrated circuit 312. That is, the compiler 316 may provide machine-readable instructions representative of the circuit design to the IC 312. As discussed below, these machine-readable instructions, when verified, may be transmitted to the FPGA along using microcode updates for the processor 130.

Figure 9:
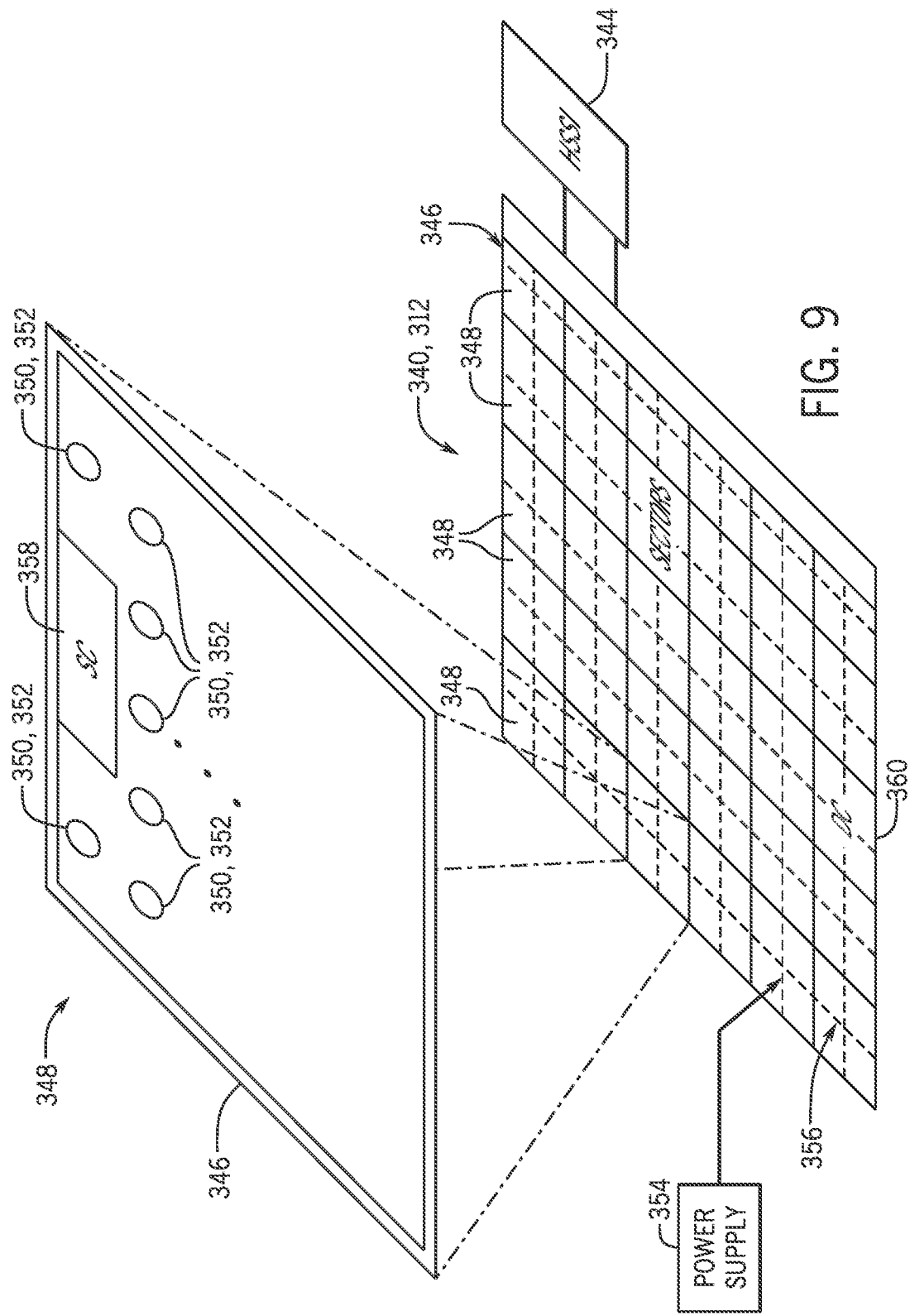
FIG. 9 is a diagram of the programmable fabric of FIG. 8, in accordance with an embodiment.

The IC 312 may include any programmable logic device, such as a field programmable gate array (FPGA) 340, as shown in FIG. 9. For the purposes of this example, the FPGA 340 is referred to as and FPGA, though it should be understood that the device may be any suitable type of programmable logic device (e.g., an application-specific integrated circuit and/or application-specific standard product). In one example, the FPGA 340 is a sectorized FPGA of the type described in U.S. Patent Publication No. 2016/0049941, "Programmable Circuit Having Multiple Sectors," which is incorporated by reference in its entirety for all purposes. The FPGA 340 may be formed on a single plane. Additionally or alternatively, the FPGA 340 may be a three-dimensional FPGA having a base die and a fabric die of the type described in U.S. Pat. No. 10,833,679, "Multipurpose Interface for Configuration Data and User Fabric Data," which is incorporated by reference in its entirety for all purposes.

In the example of FIG. 9, the FPGA 340 may include transceiver circuitry 344 for driving signals off of the FPGA 340 and for receiving signals from other devices. Interconnection resources 346 may be used to route signals, such as clock or data signals, through the FPGA 340. The FPGA 340 of FIG. 9 is sectorized, meaning that programmable logic resources may be distributed through a number of discrete programmable logic sectors 348. Each programmable logic sector 348 may include a number of programmable logic elements 350 having operations defined by configuration memory 352 (e.g., configuration random access memory (CRAM)). The programmable logic elements 350 may include combinational or sequential logic circuitry. For example, the programmable logic elements 350 may include look-up tables, registers, multiplexers, routing wires, and so forth. A designer may program the programmable logic elements 50 to perform a variety of desired functions. A power supply 354 may provide a source of voltage and current to a power distribution network (PDN) 356 that distributes electrical power to the various components of the FPGA 340. Operating the circuitry of the FPGA 40 causes power to be drawn from the power distribution network 356.

There may be any suitable number of programmable logic sectors 348 on the FPGA 340. Indeed, while 29 programmable logic sectors 348 are shown here, it should be appreciated that more or fewer may appear in an actual implementation (e.g., in some cases, on the order of 50 to 100 sectors or more). Each programmable logic sector 348 may include a sector controller (SC) 358 that controls the operation of the programmable logic sector 348. Each sector controller 358 may be in communication with a device controller (DC) 360. Each sector controller 358 may accept commands and data from the device controller 360, and may read data from and write data into its configuration memory 352 based on control signals from the device controller 360. In addition to these operations, the sector controller 358 may be augmented with numerous additional capabilities. For example, such capabilities may include locally sequencing reads and writes to implement error detection and correction on the configuration memory 352 and sequencing test control signals to effect various test modes.

The sector controllers 358 and the device controller 360 may be implemented as state machines and/or processors. For example, each operation of the sector controllers 358 or the device controller 360 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 348. This may provide usable extensibility in an efficient and easily understood way. This may be useful because new commands could bring about large amounts of local activity within the sector at the expense of only a small amount of communication between the device controller 360 and the sector controllers 358.

Each sector controller 358 thus may communicate with the device controller 360, which may coordinate the operations of the sector controllers 58 and convey commands initiated from outside the FPGA device 340. To support this communication, the interconnection resources 46 may act as a network between the device controller 360 and each sector controller 358. The interconnection resources may support a wide variety of signals between the device controller 360 and each sector controller 358. In one example, these signals may be transmitted as communication packets.

The FPGA 340 may be electrically programmed. With electrical programming arrangements, the programmable elements 350 may include one or more logic elements (wires, gates, registers, etc.). For example, during programming, configuration data is loaded into the configuration memory 352 using pins and input/output circuitry. In one example, the configuration memory 352 may be implemented as configuration random-access-memory (CRAM) cells. The use of configuration memory 352 based on RAM technology is described herein is intended to be only one example. Moreover, configuration memory 352 may be distributed (e.g., as RAM cells) throughout the various programmable logic sectors 348 the FPGA 340. The configuration memory 352 may provide a corresponding static control output signal that controls the state of an associated programmable logic element 350 or programmable component of the interconnection resources 346. The output signals of the configuration memory 352 may be applied to the gates of metal-oxide-semiconductor (MOS) transistors that control the states of the programmable logic elements 350 or programmable components of the interconnection resources 346.

The sector controllers 358 and/or the device controller 360 may determine when each sector controller 358 performs a CRAM read operation on the configuration memory 352 of its programmable logic sector 348. Each time the sector controller 358 performs a CRAM read of the configuration memory 352, power is drawn from the power distribution network 356. If too much power is drawn from the power distribution network 356 at any one time, the voltage provided by the power distribution network 356 could drop to an unacceptably low level, or too much noise could arise on the power distribution network 356. To avoid this, the device controller 360 and/or the sector controllers 358 may structure CRAM reads of the programmable logic sectors 348 to avoid excessive instantaneous power consumption by temporally and/or spatially distributing the CRAM reads across different programmable logic sectors 348.

The sector controller 58 of the programmable logic sector 348 is shown to read and write to the CRAM memory 352 by providing an ADDRESS signal to an address register 370 and providing a memory write signal (WRITE), a memory read signal (RD DATA), and/or the data to be written (WR DATA) to a data register 372. These signals may be used to cause the data register 372 to write data to or read data from a line of configuration memory 352 that has been activated along an address line 374, as provided by the ADDRESS signal applied to the address register 370. Memory read/write circuitry 376 may be used to write data into the activated configuration memory 352 cells when the data register 372 is writing data, and may be used to sense and read data from the activated configuration memory 352 cells when the data register 372 is reading data.

FPGA-Based Microarchitecture Integration

Figure 10:
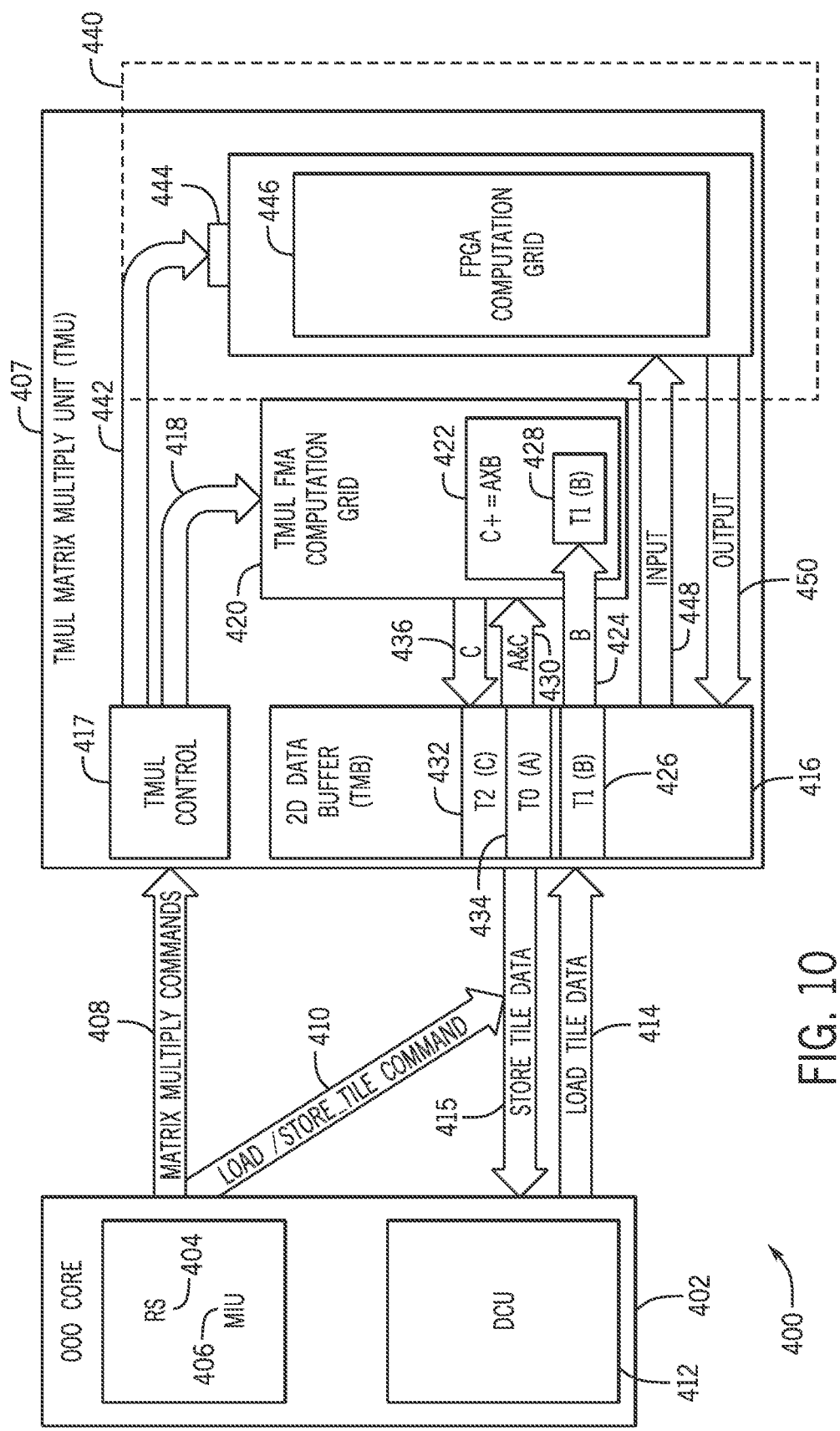
FIG. 10 is a diagram of a processor architecture including the programmable fabric of FIG. 9 in a monolithic arrangement, in accordance with an embodiment.

As previously discussed, the flexible instruction set architecture of the processor 130 may be used to integrate an embedded FPGA in the processor 130. The integration makes arithmetic logic units (ALUs) of the FPGA available for performing computations in assisting the processor 130. The flexible instruction set architecture may use an x86 memory consistency model and use a software ecosystem to provide flexible usage of instructions in the processor 130. FIG. 10 is a block diagram of an architecture 400 including an instruction set architecture for an advanced matrix extension (AMX) that may be used to integrate an FPGA into the processor 130. Although the illustrated embodiment pertains to an AMX, some embodiments may utilize other extensions that have suitable buffer sizes (e.g., >4 kB) and transfer/translation mechanisms (e.g., via data cache unit 88).

As illustrated, the architecture 400 includes an out-of-order (OOO) core 402. The OOO core 402 may include one or more execution clusters 80 of the pipeline 30 used to perform OOO operations. The OOO core 402 also includes one or more reservation stations 404 that permit the processor 130 to fetch and re-use data values once they are computed. The reservation stations 404 may be included in the scheduler unit(s) 76 of the execution engine 58 of FIG. 2B. The OOO core 402 also includes a memory instruction unit 406 (e.g., part of memory unit 60) that may be used to interface with memory (e.g., L2 cache 90).

Via the reservation stations 404 and/or the memory interface unit 404, instructions may be transmitted to a tile matrix multiply unit (TMU) 407 that is used to perform computations on the tiles 22. For instance, matrix multiply commands 408 may be used to cause the TMU 407 to perform respective multiplication and/or accumulation operations using two or more tiles 22. A load/store tile command 410 may be used to load/store tile data into tiles 22 in the memory image 24. Data may be loaded or stored from the TMU 407 via a data cache unit (DCU) 412. For instance, the DCU 412 may include/be included in the data cache unit 88 and/or physical register file(s) 78 of FIG. 2B. Via the DCU 412, the processor 130 may be used to load tile data 414 into and/or store tile data 415 from a register file (TMB) 416. The TMB 416 may include the memory image 24 of FIG. 1 and/or the physical register files(s) 78 of FIG. 2B. The TMB 416 may be relatively large (e.g., 16 kB) and may have its usage, allocation, and locations defined programmatically by the incoming matrix multiply commands 408.

The incoming matrix multiply command 408 may be interpreted by TMUL control circuitry 417 that decodes incoming instructions indicating an operation and/or sizes/locations of one or more tiles 22 to be operated on in the TMU 407. The TMU 407 decodes a matrix multiple command 408 and sends a decoded command 418 to a TMUL fused-multiply-add (FMA) computation grid 420 when the command relates to operations performable in the TMUL FMA computation grid 420. The TMUL FMA computation grid 420 is a grid of fused multiply-add units able to read from and write to the tiles 22. The dimensions of the TMUL FMA computation grid 420 may be set to a maximum size of the tiles 22 with or without some additional space for cushion. The TMUL FMA computation grid 420 performs a computation 422. Specifically, the TMUL FMA computation grid 420 may operate on a B matrix 424 that is stored in a tile 426 in the TMB 416. As illustrated, the data in the tile 426 may be loaded into a local tile 428. A read operation 430 of matrices A and C may be used to read the matrices A and C to the TMUL FMA computation grid 420 from respective tiles 432 and 434 in the TMB 416. The TMUL FMA computation grid 420 performs the computation 422. For instance, the TMUL FMA computation grid 420 may multiply the A & B matrices together and add them to the matrix C to update the value in matrix C. The update 436 to the matrix C is stored back to the tile 432 in the TMB 416. The result (e.g., matrix C 436) is then loaded back to the OOO core 402 via the DCU 412.

The TMUL FMA computation grid 420 may be tuned to certain data types (e.g., INT 8) and may be unable to utilize other data types efficiently (e.g., FP16). However, an FPGA unit 440 may be included in the TMU 407 to add flexibility.

The FPGA unit 440 may be used to extend flexibility by using the FPGA unit 440 to perform more flexible actions than are available in the TMUL FMA computation grid 420. For instance the FPGA unit 440 may be used to convert other data types to data types to which the TMUL FMA computation grid 420 is tuned thereby enabling the TMU 407 to efficiently utilize data types other than those to which the TMUL FMA computation grid 420 is tuned. To achieve such flexibility, the matrix multiply command 408 may be extended to include one or more bits in opcode to direct instructions to the FPGA unit 440 as a decoded command 442. Additionally or alternatively, at least some of the decoding of the matrix multiply command 408 may be performed in the FPGA unit 408. Additionally or alternatively, the FPGA unit 440 may utilize one or more memory controller and clock synchronization circuitries 444 to facilitate transfers of data from the TMUL control circuitry 417 and/or the TMB 416 into an FPGA computation grid 446 of the FPGA unit 440. For instance, the transfers between the TMUL control circuitry 417 and/or the TMB 416 may be asynchronous and utilizing a handshake to handle delays in handling flexible execution of instructions.

The FPGA computation grid 446 may include the programmable fabric of the FPGA unit 440 that may be configured to perform flexible functions using a configuration stored in the FPGA unit 440 via a compiled design that is created as user logic and loaded into the FPGA unit 440. In some embodiments, the configuration of the FPGA computation grid 446 may be loaded from configuration RAM (CRAM) of the FPGA unit 440 at startup of the processor. Additionally or alternatively, the configuration of the FPGA computation grid 446 may be loaded at any time designated by the processor.

The FPGA unit 440 may load data to be acted on and store data acted on in the TMB 416 based on the decoded command 442. In other words, data is extracted from the TMB 416 via a connection 448 and written back to the TMB 416 via a connection 450.

The FPGA unit 440 may support multiple instructions. These various instructions add flexibility to the processor/AMX. These flexible instructions may be programmed in by customers/users in the field. Each instruction may have its own phase-locked loop (PLL) in the one or more memory controller and clock synchronization circuitries 444. Additionally or alternatively, at least two different instructions may share a PLL. The instructions may be loaded at boot time (or another time designated by the processor) and reflected back to the operating system. As noted below, the instructions may be checked for authentication/verification of the instructions before being loaded.

Figure 11:
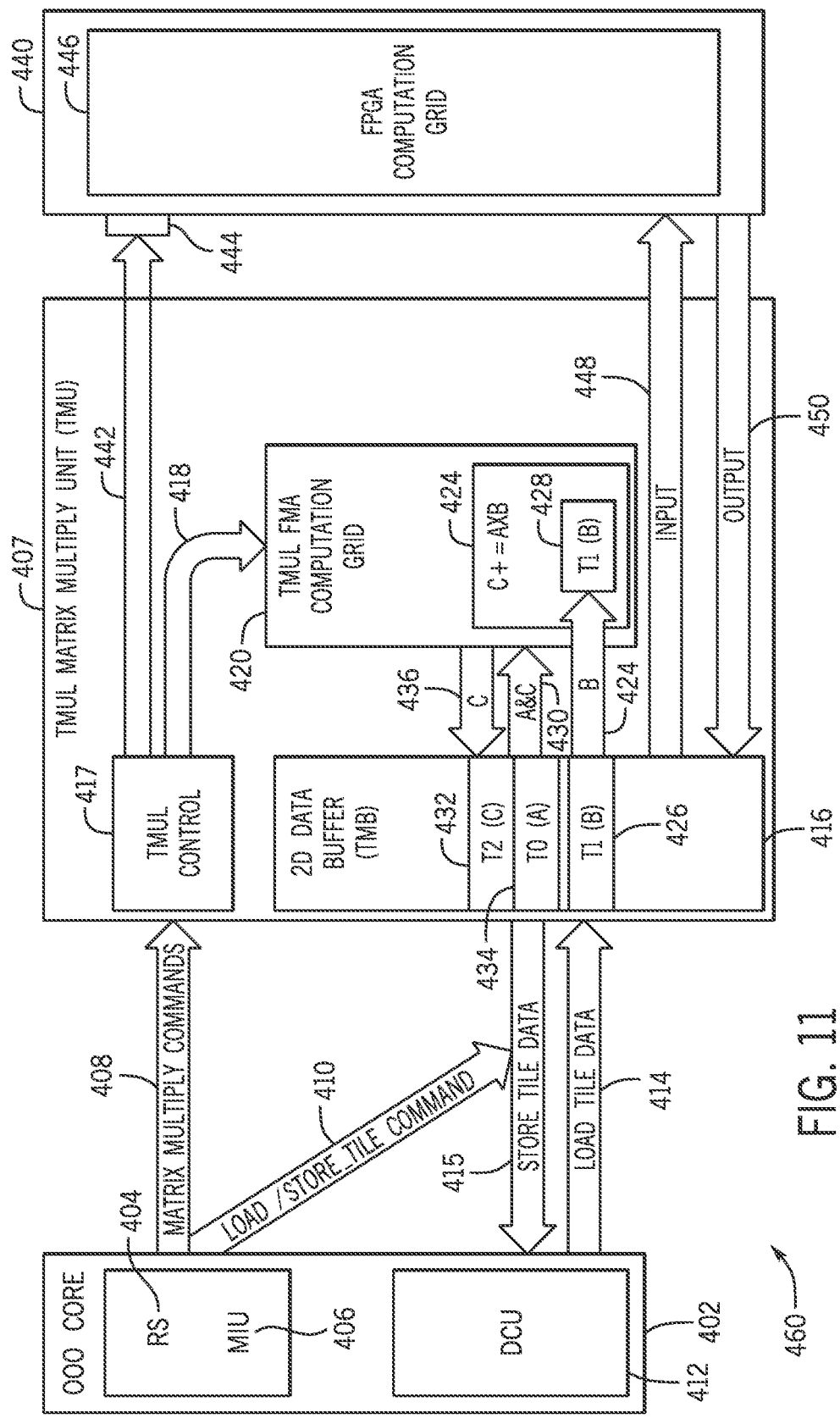
FIG. 11 is a diagram of a processor architecture including the programmable fabric of FIG. 9 with the processor and the programmable fabric located on separate silicon substrates, in accordance with an embodiment.

As illustrated, the FPGA unit 440 may be monolithically located on the same silicon as the TMU 407 with the FPGA unit 440 physically within the TMU 407. However, in some embodiments, the FPGA unit 440 may be placed on different silicon. For instance, as illustrated in FIG. 11, the FPGA unit 440 may be located on a separate die (e.g., in a three-dimensional configuration) from the rest of the TMU 407. This separation the FPGA unit 440 onto a separate die from the rest of the TMU 407 may enable the processor to be implemented as a multi-process technology. Implementation as an MCP that may reduce the costs for integrating the FPGA unit 440 into the processor. Additionally or alternatively, implementation as an MCP may reduce time to market for deployment of the processor and/or updates to the processor.

As previously noted, deployment of the FPGA-based instruction set architecture may be made available by having a stored FPGA configuration loaded at bootup of the processor as part of a cold reset or a warm reset flow. The loading at bootup may be used to overcome the delay in loading a programming bitstream into the FPGA unit 440. As such, embodiments where loading of the bitstream occurs during a reset, a single ISA manifestation via the configuration of the FPGA unit 440 may be present during a boot cycle until the processor is reset.

Since loading external configuration bitstreams may contain security and/or integrity risks, some level of authentication/verification may be applied to the configuration bitstream prior to loading. For instance, to load the configuration into the FPGA unit 440, the configuration may be stored using data transferred in a configuration bitstream distributed as part of authenticated microcode patches.

It should be understood that although the FPGA unit 440 discussed above is illustrated as enabling the processor 130 to utilize the one or more programmable fabrics (e.g., FPGAs) for acceleration via an AMX (and/or other) extension in the flexible ISA offload model, the one or more FPGAs may be utilized in additional offloads models and configurations. For example, the field programmable logic (e.g., FPGA) architecture may be leveraged as fine-grained accelerator and/or coarse-grain accelerators by utilizing one or more compute offload models (e.g., PCIE, flexible ISA) in addition to the described flexible ISA model. The FPGA may also be connected to the one or more cores 54 of the CPU by utilizing multiple 2-D and 3-D architecture configurations of the FPGA unit 440 and the CPU.

Three-Dimensional Stacked Programmable Fabric and Processor Reconfigurable Architecture As discussed above, the capabilities of a programmable fabric (e.g., FGPA unit 440) to enable fine-grained acceleration and/or coarse-grained acceleration in a two-dimensional configuration is defined based on the FPGA unit 440 location and size relative to the one or more cores 54 of the CPU. Coarse-grained acceleration may be enabled by a single large FPGA block. For finer-grained acceleration, the FPGA unit 440 may be divided into multiple smaller FPGA units 440 that are more closely tied to respective portions (e.g., cores of the processor). The various configurations of the FPGA units 440 and/or the cores 54 may restrict granularity of acceleration to either coarse-grained acceleration or fine-grained acceleration.

Figure 12:
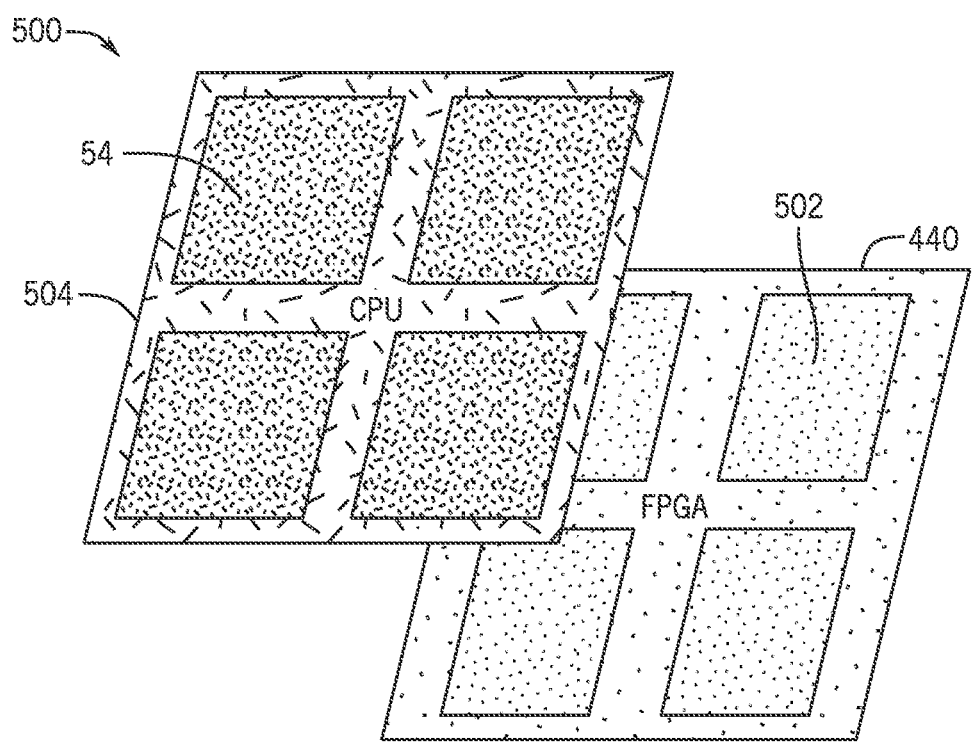
FIG. 12 is a diagram of a processor and a programmable fabric in a 3D stacked arrangement for performing fine-grained acceleration, in accordance with an embodiment.

With the foregoing in mind FIG. 12 is a diagram of the processor 504 (e.g., CPU) and the programmable fabric (e.g., FPGA unit 440) in a 3D stacked arrangement 500 for performing fine-grained acceleration, in accordance with an embodiment. The FPGA unit 440 may be 3D stacked with a multi-core central processing unit (CPU) 504 to enable coarse-grain and fine-grained acceleration functionality. The configuration of FIG. 12 is an embodiment of one possible implementation of fine-grained acceleration in the 3D configuration with a multi-core CPU 504 and the FPGA unit 440 stacked.

The 3-D attachment of the FPGA unit 440 or other field programmable array to the one or more cores 54 of the CPU 504 may be performed using any suitable packaging. For example, a three-dimensional integrated circuit face-to-face die stacking packaging-based interface (e.g., Foveros by Intel™) may be utilized to join the FPGA unit 440 to the one or more cores 54 of the CPU 504. This enables the 3-D attachment of the FPGA unit 440 as an execution unit and/or accelerator to be expanded without affecting the CPU NoC (network on a chip) performance. The FPGA unit 440 may be positioned on the bottom die in the 3D stacked construction due to the FPGA power density of an FPGA relative to the power density of the multi-core CPU 504. The FPGA unit 440 may be partitioned into one or more sections 502 according to the desired acceleration method (e.g., fine-grained acceleration, coarse-grained acceleration).

In some embodiments, the FPGA may perform fine-grained acceleration in the 3-D stacked arrangement. As discussed above, the FPGA unit 440 may be partitioned into multiple sections 502 for the fine-grained acceleration. In a fine-grained configuration, the number of sections 502 may correspond to the number of sections (e.g., cores) present in the multi-core CPU 504 and/or may be a greater number of sections than the sections present in the multi-core CPU 504. The FGPA unit 440 may be able to access the data in the one or more cores 54 via one or more interfaces that enable communication between the multi-core CPU 504 and the FPGA unit 440. The FPGA unit 440 may interface with one or more interfaces at the multi-core CPU 504 that enables the FPGA unit 440 to access the register file, L1 cache 106, L2 cache 90, or any other per core cache or register.

The ability to partition the FPGA unit 440 into multiple sections 502 may enable the FGPA unit 440 to have the sections configured as multiple small custom functional units to enable fine-grained acceleration. This enables the FPGA unit 440 to read from and write to either the register file 20 (e.g., for small functions that correspond to 1-10 clock cycles) or the L2 cache 90 (e.g., for larger functions that correspond to 10-100 clock cycles). The interface may include one or more ports for sections of the register file 20, L2 cache 90, L1 cache 120, and the like. It should be understood that the interface between the multi-core CPU 504 and the FPGA unit 440 may be configured according to desired speed of the communications, options for user configuration, and the like.

The instruction-set architecture (ISA) corresponding to the multi-core CPU 504 may be extended to open a custom opcode space with options to support the fine-grained acceleration configurations discussed above. The opcode space may be leveraged by the workload architecture to define custom instructions. The custom instructions may be leveraged by utilizing intrinsic compiler functionalities and/or hand-optimized libraries, as discussed above in the flexible ISA embodiments.

Figure 13:
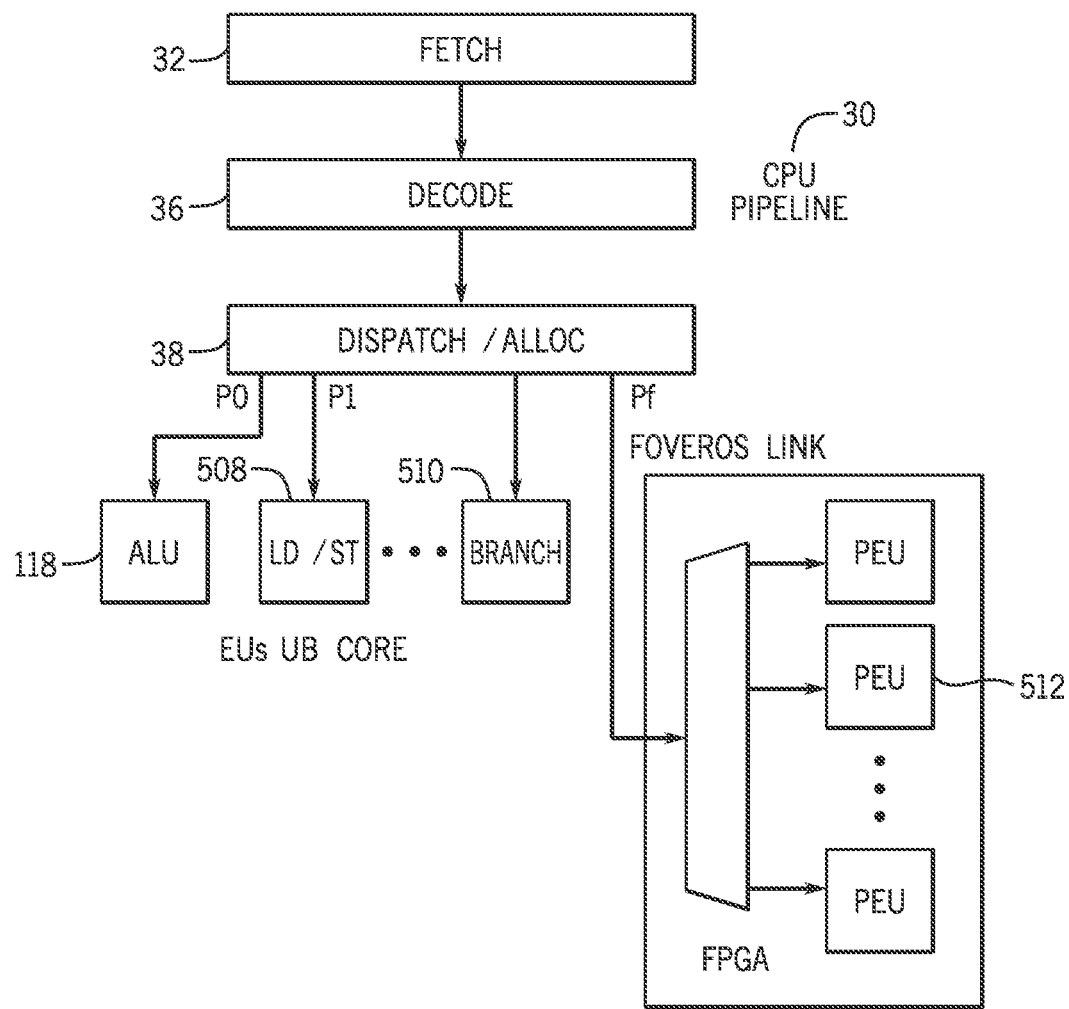
FIG. 13 is flow diagram of processor architecture including several logic blocks in combination with the programmable fabric to enable fine-grain acceleration in the 3D stacked arrangement of FIG. 12, in accordance with an embodiment.

With the foregoing in mind, FIG. 13 is a flow diagram of processor architecture including several logic blocks in combination with the FPGA unit 440 to enable fine-grain acceleration in the 3D stacked arrangement of FIG. 12, in accordance with an embodiment. The reconfigurable programmable fabric of the FPGA unit 440 may be connected to the execution units of the multi-core CPU 504 to execute a variety or processes.

As discussed above, the CPU pipeline 30 may initiate processing by performing the instruction fetch stage 32 and the instruction decoding stages 36 of the CPU pipeline 30. The decode circuitry 70 (or decoder) may decode instructions and generate, as an output, one or more micro-operations, micro-code entry points, microinstructions, other instructions, or other control signals, which are decoded from, otherwise reflect, or are derived from the original instructions. The decode circuitry 70 may be implemented using various different mechanisms. Examples of suitable mechanisms include, but are not limited to, look-up tables, hardware implementations, programmable logic arrays (PLAs), microcode read only memories (ROMs), etc. The processor core 54 may include a microcode ROM or other medium that stores microcode for macroinstructions (e.g., in decode circuitry 70 or otherwise within the front-end unit 56). The decode circuitry 70 may perform the decode stage 36 of the pipeline 30, and the allocator unit 72 performs the allocation stage 38 of the pipeline.

The allocation stage 38 may include dispatching the data to execution units in the core 54 and/or the FPGA unit 440. The execution units in the core 54 may include the arithmetic logic unit (ALU) 118, a Load and Store unit (LD/ST), and/or branch 510 among other execution units. The interface may include additional ports as mentioned above such as Port 0 which may route the data to the ALU 118 of the execution units of the multi-core CPU 504, Port 1 which may route the data to the LD/ST 508, and any other suitable number of ports may be added to route the data to any other branch 510 (e.g., execution unit) present in the core. The programmable fabric itself can be used to implement one or many custom functional units which are exposed through the custom opcodes in the instruction set architecture (ISA).

Additionally, the allocation stage 72 may include dispatching the data to the FPGA unit 440 by utilizing a Foveros by Intel™ link that enables a low-latency high-bandwidth interface between the FPGA unit 440 and the multi-core CPU 504. The data that routes through the FPGA port to the FPGA unit 440 may be routed to multiple programmable execution units (PEA) 512 within the FPGA unit 440 to enable fine-grained acceleration via the FPGA unit 440. In some embodiments, the dispatch to the execution units 512 (e.g., programmed logic in the programmable fabric) of the FPGA unit 440 may be performed via an extension architecture or any of the foregoing mechanisms.

Figure 14:
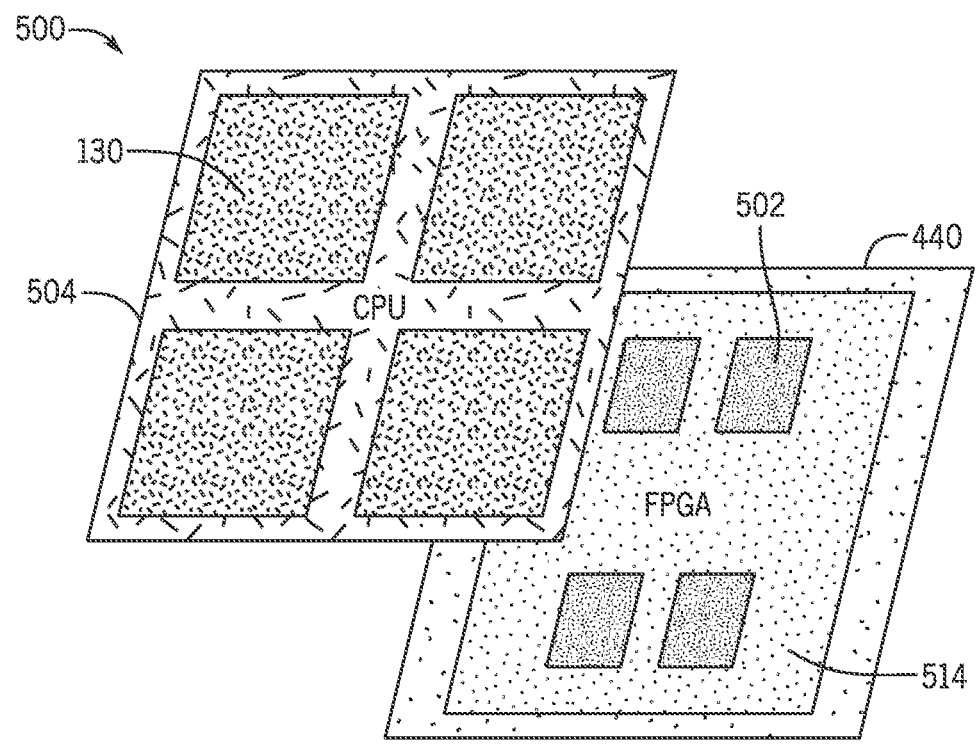
FIG. 14 is a diagram of 3D stacked hybrid architecture for the processor and programmable fabric, enabling both coarse grain and fine grained acceleration, in accordance with an embodiment.

With the foregoing in mind, FIG. 14 is a diagram of 3-D stacked hybrid architecture for the processor and programmable fabric, enabling both coarse-grained and fine-grained acceleration, in accordance with an embodiment. The programmable fabric may be divided into sections that enable hybrid architecture for both coarse-grained acceleration configurations and fine-grained acceleration configuration of the FPGA unit 440. In some embodiments, a single coarse-grained section may be deployed in the FPGA unit 440 without any fine-grained sections.

The reconfigurable fabric may enable coarse-grained acceleration by configuring the FPGA unit 440 as one or more large legacy peripheral component interconnect express (PCIe)-based accelerator devices for performing larger offload computations. The coarse-grained interface may include a system memory interface that enables a portion of the system memory to be reserved for the FPGA unit 440 to enable performing the offload computations similar to direct-attached double data rate (DDR) on legacy FPGA PCIe cards. The coarse-grained section of the FPGA 514 may also include an input output I/O interface to the multi-core CPU 504. The use of the (I/O) interface enables the coarse-grained FPGA section 514 to function as a PCIe device and may not include the PCIe physical layer. The coarse-grained FPGA section 514 may also include external general purpose input and output (GPIO) interfaces. This configuration enables legacy workloads that have already been restructured to be processed by external PCIe attached to the FPGAs to be leveraged by the 3D FPGA unit 440. In addition to the interfaces described above, it should be understood that any suitable interface may be implemented to enable the coarse-grained acceleration.

The coarse-grained configuration may also include one or more large Compute Express Link (CXL) devices that may function utilizing a shared memory and/or cache component with the CPU 504. This may enable the FPGA unit 440 to reduce latency in data processing and to simplify programming instructions. This configuration also enables a unified memory access point and enables share pointers to function across the cores and accelerators. The multi-core 54 CPU may also utilize algorithms to move data closer to the core and/or the accelerator as needed, enabling cross device accessibility.

As previously noted, the reconfigurable fabric may be used to implement the fine-grained acceleration sections 502 as detailed above in FIG. 12. The hybrid configuration of the 3D stacked FPGA unit 440 and multi-core CPU 504 enables both configurations to function simultaneously with part of the reconfigurable fabric used to communicate with the multi-core CPU 504 in a tightly-coupled fashion (e.g., dedicated to a core) and enables the remaining sections to be utilized for coarser grained accelerators.

Additionally, the 3-D stacked orientation of architecture components may also be implemented for multiple processing units in addition to the CPU 504 mentioned above. The 3-D stacked orientation of processor architecture may enable increased interconnectivity and functionality between multiple compute hardware elements. For instance, a dedicated section 502 may be aligned with a portion (e.g., core 54) of the CPU 504 to which it is tightly coupled.

Figure 15:
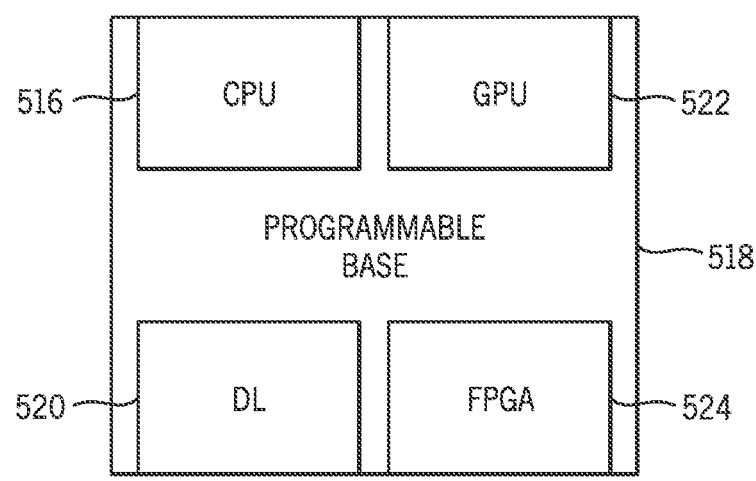
FIG. 15 is a diagram of 3-D stacked hetero-compute chiplets and a programmable fabric base die, according to embodiments of the present disclosure.

In addition or alternative to the foregoing 3-D arrangement, a CPU chiplet and other chiplets may be coupled above a programmable fabric base die. FIG. 15 is a diagram of various hetero-compute chiplets and a programmable fabric base die 518, according to embodiments of the present disclosure. The various chiplets may include a CPU chiplet 516, a dual acceleration (DL) chiplet 520, a Graphics Processing Unit (GPU) chiplet 522, an FPGA fabric chiplet 524, and or other chiplet types. The various chiplets may be stacked atop a programmable fabric base die 518 to enable reconfiguration of the programmable fabric base die 518 for multi-use functionality according to the corresponding chiplets.

The ability for the various chiplets to be 3-D stacked on the programmable fabric base die 518 enables each chiplet to stream data to the next chiplet without expensive off-chip data movement accelerators and/or providing high bandwidth interconnections to all interconnects of each of the chiplets. The programmable fabric base die 518 may be an FPGA-like fabric that includes more router resource components and fewer programmable logic components and dense computational engines than included in the standard FPGA units. In other words, the programmable fabric base die 518 is more tailored to high-speed data transport than other FPGA units that are more tailored for more computation than the programmable fabric base die 518.

The physical protocol for data transfer between the top chiplets and the programmable fabric base die 518 may be standardized at manufacture and may include various link layer protocols that may be tunneled with low latency and high bandwidth utilizing the routing resources and physical links to the programmable fabric base die 518. The programmable logic components in the programmable fabric base die 518 may be utilized to encode higher-level protocol engines specific to the compute chips assembled on the programmable fabric base die 518. With this 3-D stacked architecture, the system resources (e.g., memory, I/Os, and the like) may be provisioned dynamically based on workload specifications (e.g., memory, storage, computation power, and the like).

Figure 16:
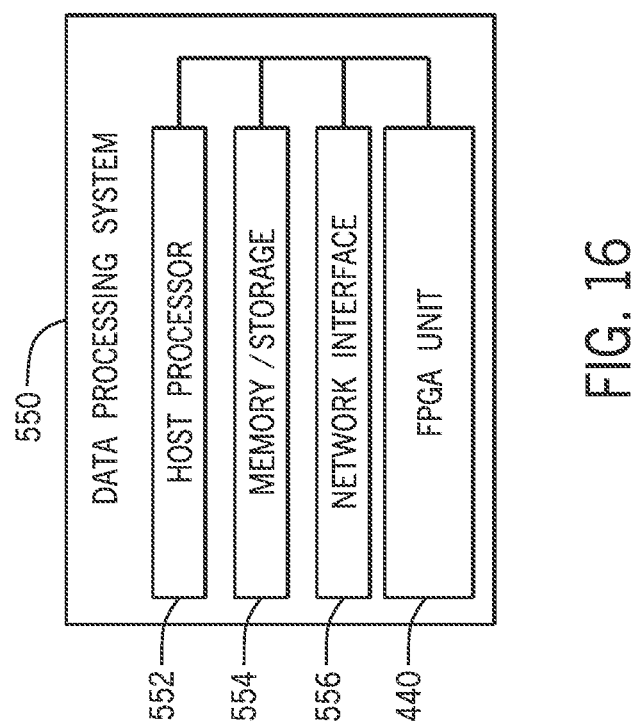
FIG. 16 is a block diagram of a data processing system including a processor with an integrated programmable fabric unit, in accordance with an embodiment.

Bearing the foregoing in mind, the multi-core CPU 504 and the FPGA unit 440 may be integrated into a data processing system or may be a component included in a data processing system. For example, the processor may be a component of a data processing system 550, shown in FIG. 16. The data processing system 550 may include a host processor 552 (e.g., the processor 130), memory and/or storage circuitry 554, and a network interface 556. The data processing system 550 may include more or fewer components (e.g., electronic display, user interface structures, application specific integrated circuits (ASICs)). The host processor 552 may include any of the foregoing processors that may manage a data processing request for the data processing system 550 (e.g., to perform encryption, decryption, machine learning, video processing, voice recognition, image recognition, data compression, database search ranking, bioinformatics, network security pattern identification, spatial navigation, cryptocurrency operations, or the like). The memory and/or storage circuitry 554 may include random access memory (RAM), read-only memory (ROM), one or more hard drives, flash memory, or the like. The memory and/or storage circuitry 554 may hold data to be processed by the data processing system 550. In some cases, the memory and/or storage circuitry 554 may also store configuration programs (bitstreams) for programming the FPGA unit 440. The network interface 556 may allow the data processing system 550 to communicate with other electronic devices. The data processing system 550 may include several different packages or may be contained within a single package on a single package substrate. For example, components of the data processing system 550 may be located on several different packages at one location (e.g., a data center) or multiple locations. For instance, components of the data processing system 550 may be located in separate geographic locations or areas, such as cities, states, or countries.

In one example, the data processing system 550 may be part of a data center that processes a variety of different requests. For instance, the data processing system 550 may receive a data processing request via the network interface 556 to perform encryption, decryption, machine learning, video processing, voice recognition, image recognition, data compression, database search ranking, bioinformatics, network security pattern identification, spatial navigation, digital signal processing, or some other specialized task.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible, or purely theoretical. Further, if any claims appended to the end of this specification contain one or more elements designated as "means for [perform] ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

Example Embodiments of the Disclosure

The following numbered clauses define certain example embodiments of the present disclosure.

Clause 1

A system comprising:
a processor having one or more cores; and
a programmable fabric device, wherein the processor is stacked in a three-dimensional orientation above the programmable fabric device, and wherein the programmable fabric device comprises:
  a programmable fabric comprising a plurality of partitions configured to perform fine-grained acceleration operations; and
  one or more interfaces configured to provide connections between the
  programmable fabric and the processor, wherein the programmable fabric device is operable to:
    receive one or more sets of data from a processor pipeline via the one or more interfaces;
    configure a first portion of the programmable fabric comprising the plurality of partitions coupled to one or more executions units of the one or more cores of the processor to perform the fine-grained acceleration operations, wherein the fine-grained acceleration operations comprise extending an instruction-set architecture of the processor to initiate a custom opcode space to interface with the programmable fabric;
    receive one or more additional sets of data from the processor pipeline; and
configure a second portion of the programmable fabric comprising one or more system memory portions reserved for the programmable fabric to interface with the processor to perform coarse-grained acceleration operations.

Clause 2

The system of clause 1, wherein the fine-grained acceleration operations comprise performing operations that read and write data to and from a register file, an L1 cache, an L2 cache, or any other per-core cache of the processor.

Clause 3

The system of clause 2, wherein the one or more interfaces comprise one or more ports for sections of the register file, the L1 cache, the L2 cache, or any other per-core cache of the processor.

Clause 4

The system of clause 1, wherein the one or more interfaces comprise a three-dimensional integrated circuit face-to-face die stacking packaging-based interface.

Clause 5

The system of clause 1, wherein a number of the plurality of partitions corresponds to at least the number of the one or more cores of the processor.

Clause 6

The system of clause 1, wherein the fine-grained acceleration and the coarse-grained acceleration operations are performed concurrently by configuring the first portion of the programmable fabric for the fine-grained acceleration operations and configuring the second portion of the programmable fabric for the coarse-grained acceleration operations.

Clause 7

The system of clause 1, wherein the coarse-grained acceleration operations comprise performing operations using one or more compute express link (CXL) devices that utilize a shared memory component with the processor.

Clause 8

The system of clause 1, wherein the one or more interfaces comprise one or more input/outputs (I/Os) of the programmable fabric, one or more external general-purpose input/outputs (GPIOs), or both.

Clause 9

The system of clause 1, wherein a workload architecture of the processor leverages the custom opcode space to define a set of custom instructions to perform the fine-grained acceleration operations.

Clause 10

The system of clause 9, wherein the set of custom instructions are leveraged by a compiler, curated libraries, or both.

Clause 11

The system of clause 1, where in the programmable fabric device comprises a field-programmable gate array (FPGA).

Clause 12

A method of data transfer between a processor stacked in a three-dimensional orientation above a programmable fabric device comprising:
  receiving, via the processor, one or more sets of data from a processor pipeline via one or more interfaces; configuring, via the processor, a first portion of a programmable fabric of the programmable fabric device comprising a plurality of partitions coupled to one or more execution units of one or more cores of the processor to perform fine-grained acceleration operations, wherein the fine-grained acceleration operations comprise extending an instruction-set architecture of the processor to initiate a custom opcode space to interface with the programmable fabric;
  receiving, via the processor, one or more additional sets of data from the processor pipeline; and
  configuring, via the processor, a second portion of the programmable fabric comprising one or more system memory portions reserved for the programmable fabric to interface with the processor to perform coarse-grained acceleration operations on the one or more additional sets of data.

Clause 13

The method of clause 12, comprising performing, via the processor, the fine-grained acceleration and the coarse-grained acceleration operations concurrently by configuring the first portion of the programmable fabric for the fine-grained acceleration operations and configuring the second portion of the programmable fabric for the coarse-grained acceleration operations concurrently.

Clause 14

The method of clause 12, comprising performing, via the processor, the coarse-grained acceleration with one or more external general-purpose input/outputs (GPIOs) operable to provide an interface for the programmable fabric with the processor to perform the coarse-grained acceleration operations.

Clause 15

The method of clause 12, wherein the coarse-grained acceleration operations comprise performing operations using one or more compute express link (CXL) devices that utilize a shared memory component with the processor.

Clause 16

The method of clause 12, wherein performing the fine-grained acceleration operations comprises performing operations that read and write data to and from a register file, an L1 cache, an L2 cache, or any other per core cache of the processor.

Clause 17

A system comprising:
one or more compute chiplets;
a programmable fabric base die, wherein the one or more compute chiplets are stacked in a three-dimensional orientation above the programmable fabric base die, and wherein the programmable fabric base die comprises one or more interfaces configured to provide connections between the programmable fabric and the one or more compute chiplets, wherein the programmable fabric base die is operable to:
  enable data transfer between the one or more compute chiplets that are three-dimensionally stacked above the programmable fabric base die; and
  receive, via the one or more compute chiplets, one or more sets of data via the one or more interfaces;
  configure, via the one or more compute chiplets, a first portion of the programmable fabric base die comprising a plurality of partitions coupled to one or more portions of the one or more compute chiplets to perform fine-grained acceleration operations, wherein the fine-grained acceleration operations comprise extending an instruction-set architecture of the one or more compute chiplets to initiate a custom opcode space to interface with the programmable fabric base die;
  receive, via the one or more compute chiplets, one or more additional sets of data via the one or more interfaces; and
  configure, via the one or more compute chiplets, a second portion of the programmable fabric base die comprising one or more system memory portions reserved for the programmable fabric to interface with the one or more compute chiplets to perform coarse-grained acceleration operations on the one or more additional sets of data.

Clause 18

The system of clause 17, wherein the one or more compute chiplets comprises one or more Central Processing Unit (CPU) chiplets, one or more Graphical Processing Unit (GPU) chiplets, one or more Dual accelerator (DL) chiplets, or any combination thereof.

Clause 19

The system of clause 17, wherein the one or more compute chiplets provision a memory, one or input/output (I/O) resources, or both dynamically based on an expected workload of the one or more compute chiplets.

Clause 20

The system of clause 17, wherein the programmable fabric base die comprises a field-programmable gate array (FPGA).

What is claimed is:

1. A system comprising:
a processor having one or more cores; and
a programmable fabric device, wherein the processor is stacked in a three-dimensional orientation above the programmable fabric device, and wherein the programmable fabric device comprises:
  a programmable fabric comprising a plurality of partitions configured to perform fine-grained acceleration operations; and
  one or more interfaces configured to provide connections between the
  programmable fabric and the processor, wherein the programmable fabric device is operable to:
    receive one or more sets of data from a processor pipeline via the one or more interfaces;
    configure a first portion of the programmable fabric comprising the plurality of partitions coupled to one or more executions units of the one or more cores of the processor to perform the fine-grained acceleration operations, wherein the fine-grained acceleration operations comprise extending an instruction-set architecture of the processor to initiate a custom opcode space to interface with the programmable fabric;
    receive one or more additional sets of data from the processor pipeline; and
    configure a second portion of the programmable fabric comprising one or more system memory portions reserved for the programmable fabric to interface with the processor to perform coarse-grained acceleration operations.

2. The system of claim 1, wherein the fine-grained acceleration operations comprise performing operations that read and write data to and from a register file, an L1 cache, an L2 cache, or any other per-core cache of the processor.

3. The system of claim 2, wherein the one or more interfaces comprise one or more ports for sections of the register file, the L1 cache, the L2 cache, or any other per-core cache of the processor.

4. The system of claim 1, wherein the one or more interfaces comprise a three-dimensional integrated circuit face-to-face die stacking packaging-based interface.

5. The system of claim 1, wherein a number of the plurality of partitions corresponds to at least the number of the one or more cores of the processor.

6. The system of claim 1, wherein the fine-grained acceleration and the coarse-grained acceleration operations are performed concurrently by configuring the first portion of the programmable fabric for the fine-grained acceleration operations and configuring the second portion of the programmable fabric for the coarse-grained acceleration operations.

7. The system of claim 1, wherein the coarse-grained acceleration operations comprise performing operations using one or more compute express link (CXL) devices that utilize a shared memory component with the processor.

8. The system of claim 1, wherein the one or more interfaces comprise one or more input/outputs (I/Os) of the programmable fabric, one or more external general-purpose input/outputs (GPIOs), or both.

9. The system of claim 1, wherein a workload architecture of the processor leverages the custom opcode space to define a set of custom instructions to perform the fine-grained acceleration operations.

10. The system of claim 9, wherein the set of custom instructions are leveraged by a compiler, curated libraries, or both.

11. The system of claim 1, where in the programmable fabric device comprises a field-programmable gate array (FPGA).

12. A method of data transfer between a processor stacked in a three-dimensional orientation above a programmable fabric device comprising:
    receiving, via the processor, one or more sets of data from a processor pipeline via one or more interfaces; configuring, via the processor, a first portion of a programmable fabric of the programmable fabric device comprising a plurality of partitions coupled to one or more execution units of one or more cores of the processor to perform fine-grained acceleration operations, wherein the fine-grained acceleration operations comprise extending an instruction-set architecture of the processor to initiate a custom opcode space to interface with the programmable fabric;
    receiving, via the processor, one or more additional sets of data from the processor pipeline; and
    configuring, via the processor, a second portion of the programmable fabric comprising one or more system memory portions reserved for the programmable fabric to interface with the processor to perform coarse-grained acceleration operations on the one or more additional sets of data.

13. The method of claim 12, comprising performing, via the processor, the fine-grained acceleration and the coarse-grained acceleration operations concurrently by configuring the first portion of the programmable fabric for the fine-grained acceleration operations and configuring the second portion of the programmable fabric for the coarse-grained acceleration operations concurrently.

14. The method of claim 12, comprising performing, via the processor, the coarse-grained acceleration operations with one or more external general-purpose input/outputs (GPIOs) operable to provide an interface for the programmable fabric with the processor to perform the coarse-grained acceleration operations.

15. The method of claim 12, wherein the coarse-grained acceleration operations comprise performing operations using one or more compute express link (CXL) devices that utilize a shared memory component with the processor.

16. The method of claim 12, wherein performing the fine-grained acceleration operations comprises performing operations that read and write data to and from a register file, an L1 cache, an L2 cache, or any other per core cache of the processor.

17. A system comprising:
    one or more compute chiplets;
    a programmable fabric base die, wherein the one or more compute chiplets are stacked in a three-dimensional orientation above the programmable fabric base die, and wherein the programmable fabric base die comprises one or more interfaces configured to provide connections between the programmable fabric base die and the one or more compute chiplets, wherein the programmable fabric base die is operable to:
        enable data transfer between the one or more compute chiplets that are three-dimensionally stacked above the programmable fabric base die; and
        receive, via the one or more compute chiplets, one or more sets of data via the one or more interfaces;
        configure, via the one or more compute chiplets, a first portion of the programmable fabric base die comprising a plurality of partitions coupled to one or more portions of the one or more compute chiplets to perform fine-grained acceleration operations, wherein the fine-grained acceleration operations comprise extending an instruction-set architecture of the one or more compute chiplets to initiate a custom opcode space to interface with the programmable fabric base die;
        receive, via the one or more compute chiplets, one or more additional sets of data via the one or more interfaces; and
        configure, via the one or more compute chiplets, a second portion of the programmable fabric base die comprising one or more system memory portions reserved for the programmable fabric base die to interface with the one or more compute chiplets to perform coarse-grained acceleration operations on the one or more additional sets of data.

18. The system of claim 17, wherein the one or more compute chiplets comprises one or more Central Processing Unit (CPU) chiplets, one or more Graphical Processing Unit (GPU) chiplets, one or more Dual accelerator (DL) chiplets, or any combination thereof.

19. The system of claim 17, wherein the one or more compute chiplets provision a memory, one or input/output (I/O) resources, or both dynamically based on an expected workload of the one or more compute chiplets.

20. The system of claim 17, wherein the programmable fabric base die comprises a field-programmable gate array (FPGA).

* * * * *